(12) United States Patent
Kwak et al.

(10) Patent No.: US 8,795,817 B2
(45) Date of Patent: Aug. 5, 2014

(54) PHOSPHOR FILM, METHOD OF MANUFACTURING THE SAME, COATING METHOD OF PHOSPHOR LAYER, METHOD OF MANUFACTURING LED PACKAGE, AND LED PACKAGE MANUFACTURED THEREBY

(75) Inventors: Chang Hoon Kwak, Seoul (KR); Il Woo Park, Gyeonggi-do (KR); Kyu Jin Lee, Gyeonggi-do (KR); Cheol Jun Yoo, Chungcheongnam-do (KR); Seong Jae Hong, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/818,373

(22) PCT Filed: Aug. 24, 2011

(86) PCT No.: PCT/KR2011/006254
§ 371 (c)(1),
(2), (4) Date: Feb. 22, 2013

(87) PCT Pub. No.: WO2012/026757
PCT Pub. Date: Mar. 1, 2012

(65) Prior Publication Data
US 2013/0149508 A1     Jun. 13, 2013

(30) Foreign Application Priority Data

Aug. 25, 2010   (KR) .................. 10-2010-0082640
Aug. 23, 2011   (KR) .................. 10-2011-0083886

(51) Int. Cl.
| | | |
|---|---|---|
| B32B 3/10 | (2006.01) | |
| B32B 5/16 | (2006.01) | |
| H01L 33/50 | (2010.01) | |
| C09K 11/06 | (2006.01) | |

(52) U.S. Cl.
CPC ... *B32B 3/10* (2013.01); *B32B 5/16* (2013.01); *H01L 33/50* (2013.01); *C09K 11/06* (2013.01)
USPC .......... 428/195.1; 428/206; 428/690; 257/98; 257/E33.061; 252/301.4 R; 438/29

(58) Field of Classification Search
CPC ............ B32B 3/10; B32B 5/16; H01L 33/50; C09K 11/06
USPC ................... 428/206, 690; 257/98, E33.061; 438/29; 252/301.4 R
See application file for complete search history.

(56) References Cited

U.S. PATENT DOCUMENTS

| | | | | |
|---|---|---|---|---|
| 5,653,830 | A | * | 8/1997 | Fleig et al. ................ 156/67 |
| 2009/0065790 | A1 | | 3/2009 | Chitnis et al. |
| 2010/0295079 | A1 | * | 11/2010 | Melman .................... 257/98 |

FOREIGN PATENT DOCUMENTS

| | | |
|---|---|---|
| JP | 2003-101074 | 4/2003 |
| JP | 2003101074 | 4/2003 |

(Continued)

OTHER PUBLICATIONS

International Preliminary Report on Patentability dated Mar. 7, 2013 in corresponding International Appln. No. PCT/KR2011/006254.

*Primary Examiner* — Elizabeth Mulvaney
(74) *Attorney, Agent, or Firm* — F. Chau & Associates, LLC

(57) ABSTRACT

There are provided a phosphor film, a method of manufacturing the same, and a method of coating an LED chip with a phosphor layer. The phosphor film includes: a base film; a phosphor layer formed on the base film and obtained by mixing phosphor particles in a partially cured resin material; and a cover film formed on the phosphor layer to protect the phosphor layer.

15 Claims, 22 Drawing Sheets

(56) References Cited

FOREIGN PATENT DOCUMENTS

| KR | 1020060109221 | 10/2006 |
| KR | 1020070009948 | 1/2007 |
| KR | 100803730 | 2/2008 |
| KR | 1020080070193 | 7/2008 |

* cited by examiner

PHOSPHOR FILM, METHOD OF MANUFACTURING THE SAME, COATING METHOD OF PHOSPHOR LAYER, METHOD OF MANUFACTURING LED PACKAGE, AND LED PACKAGE MANUFACTURED THEREBY

TECHNICAL FIELD

The present invention relates to a phosphor film, a method of manufacturing the same, a coating method of coating a light emitting diode (LED) chip with a phosphor layer, a method of manufacturing a light emitting device package, and a light emitting device package manufactured thereby.

BACKGROUND ART

A light emitting diode (LED), known as a next generation light source, has many positive attributes such as a relatively long lifespan, low power consumption, a rapid response rate, environmentally friendly characteristics, and the like, as compared with a light source according to the related art, and has been used as an important light source in various products such as illumination devices and back light units for display devices. In particular, Group III nitride-based LEDs including GaN, AlGaN, InGaN, InAlGaN, and the like have been used in semiconductor light emitting devices outputting blue or ultraviolet light.

In general, a reflective layer is formed under an LED chip and light is emitted upwardly and from four sides thereof, that is, the front, the rear, left and right of the LED chip, and therefore, when a light emission color is changed using a phosphor material, it may be an important issue to coat an upper surface of a chip and four sides thereof with a phosphor material to have a uniform thickness in order to secure a uniform quality of light. Thus, various conformal LED chip coating techniques have been proposed, but since a majority of the techniques are applied prior to a wire bonding process, the application thereof are limited to a flip-chip type package or an additional process is required to open a separate wire bonding pad part during phosphor coating. Further, such a technique is used in a free mold lead frame-type packaging process and may be difficult to be applied to a case in which a phosphor is coated with respect to individual chips.

As a packaging method in which a phosphor is coated after a bonding process is completed, there is a dispensing process in which phosphor particles are dispersed in a resin having high heat resistance and light transmission to produce a paste phase and a minute amount thereof is ejected through a nozzle having a predetermined diameter to then coat the entire chip with phosphors. In this process there is a need to appropriately maintain a viscosity adjusted between phosphor particles and a resin in order to eject an appropriate amount of micro liquid droplets. Here, a solid phase of inorganic phosphor particles have partial sedimentation during a coating process, even after being dispensed, until a phosphor paste is cured, due to a relatively low viscosity being required for implementation of the coating process, within a tube storing matters in equipment, and therefore, dispersibility of phosphor particles may be deteriorated in a resin, and light scattering may be increased.

DISCLOSURE

Technical Problem

An aspect of the present invention provides a phosphor film having a structure in which a phosphor layer can be coated to have a uniform thickness, a method of manufacturing the same, coating a light emitting chip with a phosphor layer by using the phosphor film, a method of manufacturing a light emitting device package, and a light emitting device package manufactured thereby.

Technical Solution

According to an aspect of the present invention, there is provided a phosphor film including: a base film; a phosphor layer formed on the base film and obtained by mixing phosphor particles in a partially cured resin material; and a cover film formed on the phosphor layer to protect the phosphor layer.

The phosphor layer may be in a partially cured state at normal temperature and may have a phase change to be movable upon being heated.

The phosphor layer may have a modulus value between 100 Mpa or higher and 500 Mpa or less in a temperature range of 0° C. to 25° C. and may have a modulus value between 0.5 Mpa or higher and 3 Mpa or less in a temperature range of 60° C. to 80° C.

In the phosphor layer, the modulus value at 80° C. may, have a value of 10% or less of the modulus value at 25° C.

The base film may be formed of an expandable polymer material, for example, a polyolefin material.

The phosphor layer and the cover film may include a temporary adhesive layer formed therebetween.

The phosphor layer may be configured of a plurality of phosphor strips spaced apart from one another by a predetermined interval, and the cover film may be formed of a plurality of cover film strips having a size corresponding to that of the plurality of phosphor strips.

The phosphor layer may further include a spacer having a predetermined thickness and formed of a light transmissive material, and the spacer may have a surface coated with a reflective layer.

According to another aspect of the present invention, there is provided a method of manufacturing a phosphor film, the method including: preparing a base film; and forming a phosphor layer on the base film, the phosphor layer being formed of a material obtained by mixing phosphor particles in a partially cured resin material and configured of a plurality of phosphor strips spaced apart from one another by a predetermined interval.

The forming of the phosphor layer may include: forming a thin film on the base film, the thin film being obtained by mixing the phosphor particles in the partially cured resin material; forming a cover film on the thin film; forming a cutting line along which the thin film and the cover film are cut into strips having a predetermined size; and expanding the base film such that the thin film and the cover film are separated along the cutting line.

The forming of the cutting line may include forming a plurality of first cutting lines on the thin film and the cover film to be in line in a single direction; and cutting the thin film, the cover film and the base film along a second cutting line perpendicular to the first cutting line to have a strip form.

The forming of the phosphor layer may include: forming the thin film on the base film, the thin film being obtained by mixing the phosphor particles in the partially cured resin material; forming a plurality of the first cutting lines on the thin film to be in line in a single direction; expanding the base film such that the thin film is divided into a plurality of regions along the first cutting line; forming the cover film on the thin film; and cutting the cover film, the thin film and the base film along the second cutting line perpendicular to the first cutting line to have a strip form.

The forming of the phosphor layer may include: disposing a mask on the base film, the mask including a plurality of holes having a size corresponding to that of the plurality of phosphor strips; forming the thin film by printing the material obtained by mixing the phosphor particles in the partially cured resin material on the base film, by using the mask; and forming the cover film on the thin film.

According to another aspect of the present invention, there is provided a method of coating a light emitting device with a phosphor material, the method including: preparing a phosphor film including a phosphor layer formed of a material obtained by mixing phosphor particles in a partially cured resin material; and coating with the phosphor layer by applying heat to the phosphor layer to have mobility generated thereby and by pressing and adhering the phosphor layer having the generated mobility to the vicinity of the light emitting device.

The phosphor film may include a base film having the phosphor layer formed therein and a cover film protecting the phosphor layer, the phosphor layer may be divided into a plurality of phosphor strips cut to have a size corresponding to the light emitting device, and the cover film may be divided into a plurality of cover film strips cut, together with cutting of the phosphor layer, to have a size corresponding to the light emitting devices.

The coating of the phosphor layer may include: lifting one phosphor strip and one cover film strip from the base film; disposing the lifted phosphor strip and cover film strip such that the phosphor strip faces the light emitting device; and applying heat to the lifted phosphor strip, and pressing and adhering the phosphor strip having the generated mobility to the vicinity of the light emitting device.

The method may further include emitting ultraviolet light to reduce adhesive force between the base film and the phosphor strip.

The coating of the phosphor layer may include: separating the cover film from the phosphor film; disposing the phosphor film from which the cover film has been lifted, such that one of the plurality of phosphor strips faces the emitting light device; and separating the phosphor strip from the base film by applying pressure to a surface different from a surface of the base film on which the phosphor strip is disposed, and pressing and adhering the phosphor strip having the generated mobility to the vicinity of the light emitting device by applying heat to the phosphor strip.

The method may further include emitting ultraviolet light to reduce the adhesive force between the base film and the phosphor layer.

The light emitting device may be configured in plural, and respective phosphor strips among the plurality of phosphor strips may be sequentially coated in the vicinity of the plurality of light emitting devices while applying pressure through a roller to a surface different from a surface of the base film on which the plurality of phosphor strips are disposed.

The light emitting device may be configured in plural, and the plurality of phosphor strips may be coated in the vicinity of the plurality of light emitting devices while concurrently applying pressure to the plurality of phosphor strips to the different surface from the surface of the base film on which the plurality of phosphor strips are disposed.

According to another aspect of the present invention, there is provided a method of manufacturing a light emitting device package, the method including: preparing a base film and a phosphor film including a phosphor layer obtained by mixing phosphor particles in a partially cured resin material on the base film; preparing at least one light emitting device and disposing the phosphor film on an upper part of the light emitting device so as to allow the phosphor layer to face the light emitting device; and applying heat to the phosphor layer to have mobility generated thereby and coating at least portions of an upper surface and sides of the light emitting device with the phosphor layer by allowing the phosphor layer having the generated mobility to flow toward a surface of the light emitting device. The phosphor film may further include a cover film protecting the phosphor layer, the phosphor layer may be divided into a plurality of phosphor strips cut to have a size corresponding to the light emitting device, and the cover film may be divided into a plurality of cover film strips cut, together with cutting of the phosphor layer, to have a size corresponding to the light emitting devices.

The coating of the phosphor layer may include: lifting one phosphor strip and one cover film strip from the base film; disposing the lifted phosphor strip and cover film strip such that the phosphor strip faces the light emitting device; and applying heat to the lifted phosphor strip to have mobility generated thereby and coating a surface of the light emitting device by allowing the phosphor strip having the generated mobility to be separated from the cover film strip and flow toward the surface of the light emitting device.

The coating of the phosphor layer may include: forming a receiving hole in the phosphor layer in a position corresponding to a position of at least one electrode of the light emitting device including the at least one electrode; adhering the phosphor film to an upper part of the light emitting device, in a structure in which the phosphor layer faces the light emitting device such that the electrode of the light emitting device is received within the receiving hole; and exposing the electrode by lifting the base film and performing a coating process by applying heat to the phosphor layer to have mobility generated thereby so as to allow the phosphor layer having the generated mobility to flow along a surface of the plurality of light emitting devices.

The light emitting device may be arrayed in plural, the phosphor layer may include a plurality of receiving holes to respectively correspond to positions of the electrodes of the respective light emitting devices, and the plurality of light emitting devices may be coated by being integrally covered.

The phosphor layer may be in a partially cured state at normal temperature and may have a phase change to be movable upon being heated.

The phosphor layer may have a modulus value between 100 Mpa or higher and 500 Mpa or less in a temperature range of 0° C. to 25° C., and a modulus value between 0.5 Mpa or higher and 3 Mpa or less in a temperature range of 60° C. to 80° C.

In the phosphor layer, the modulus value at 80° C. may have a value of 10% or less of the modulus value at 25° C.

The light emitting device may include at least one electrode formed on an upper surface thereof to be electrically connected to a wire, and the phosphor layer may be coated along a shape of the wire to have a shape corresponding to that of the wire.

The light emitting device may include an LED chip having a semiconductor layer and an active layer, and the phosphor layer may cover at least one side of the active layer in sides of the light emitting device.

According to another aspect of the present invention, there is provided a light emitting device package including: at least one light emitting device; a phosphor layer formed of a material obtained by mixing phosphor particles in a partially cured resin material and covering at least portions of an upper surface and sides of the light emitting device; and a main body part having the light emitting device mounted therein and electrically connected to an electrode included in the light emitting device, wherein the phosphor layer is in a partially cured state at normal temperature and has a phase change to be movable upon being heated.

The phosphor layer may have a modulus value between 100 Mpa or higher and 500 Mpa or less in a temperature range of 0° C. to 25° C., and a modulus value between 0.5 Mpa or higher and 3 Mpa or less in a temperature range of 60° C. to 80° C.

In the phosphor layer, the modulus value at 80° C. may have a value of 10% or less of the modulus value at 25° C.

The light emitting device may be wire-bonded to the electrode provided with an upper surface thereof through at least one wire, and the phosphor layer may be coated along a shape of the wire to have a shape corresponding to that of the wire.

The light emitting device may be wire-bonded to the electrode provided with the upper surface thereof through the at least one wire, and the phosphor layer may cover the upper surface and the sides of the light emitting device, excepting the electrode.

The light emitting device may include an LED chip having a semiconductor layer and an active layer, and the phosphor layer may cover at least one side of the active layer in sides of the light emitting device.

The light emitting device package may further include an encapsulating part formed above the main body part and covering the light emitting device to protect the light emitting device including the phosphor layer.

Advantageous Effects

As set forth above, in a phosphor film according to an embodiment of the present invention, a phosphor layer may be configured to have properties in which it is in a partially cured state and a modulus is reduced upon being heated, such that the phosphor layer can be coated to have a uniform thickness around a light emitting chip. In particular, even in a case in which a wire-bonded light emitting chip is coated, the coating of a phosphor layer may be obtained without transformation of a wire.

In a method of manufacturing a phosphor film, a method of coating a light emitting diode (LED) chip with a phosphor layer, a method of manufacturing an LED package, and an LED package manufactured thereby: a phosphor film may be manufactured to have a form in which the phosphor layer can be easily coated on the LED chip; and a phosphor layer may be coated to have a uniform thickness around various types of LED chips by using the same, whereby a light emitting device having excellent quality of light may be manufactured.

DESCRIPTION OF DRAWINGS

The above and other aspects, features and other advantages of the present invention will be more clearly understood from the following detailed description taken in conjunction with the accompanying drawings, in which.

MODE FOR INVENTION

Figure 1:
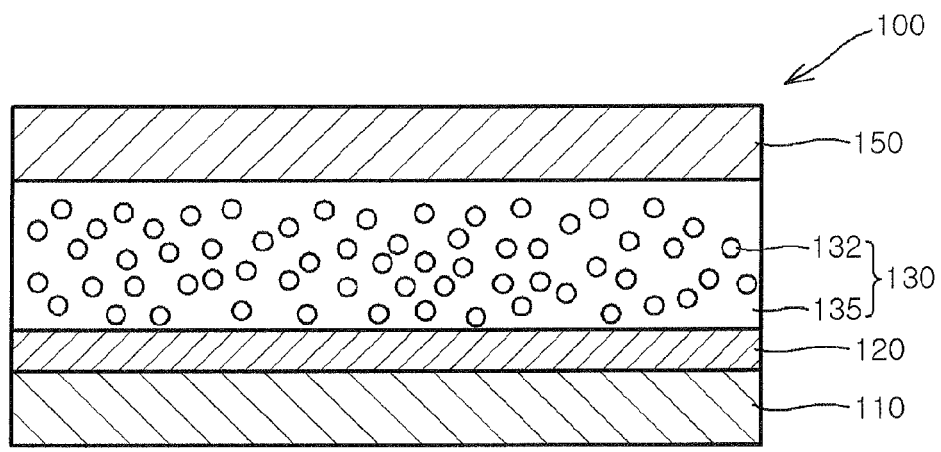
FIG. 1 illustrates a structure of a phosphor film according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2A:
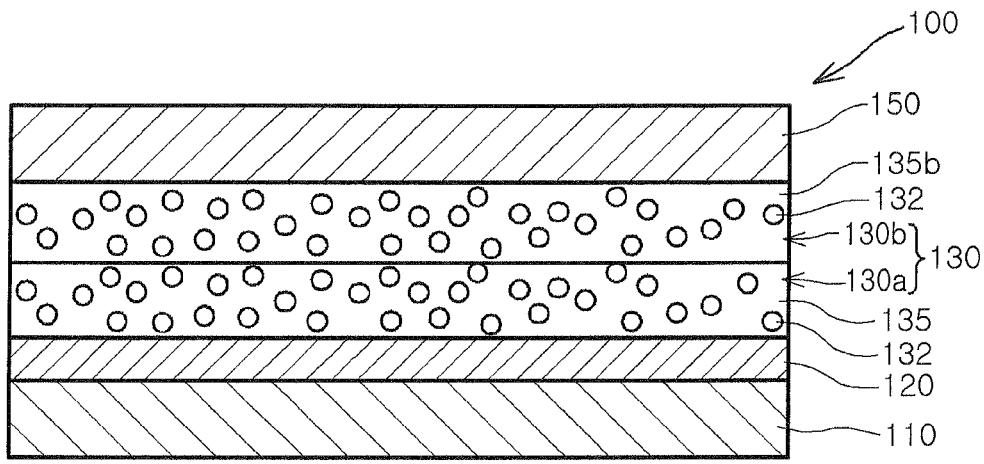
FIGS. 2A through 2C schematically illustrate a structure of a phosphor layer in the phosphor film of FIG. 1.
Figure 2B:
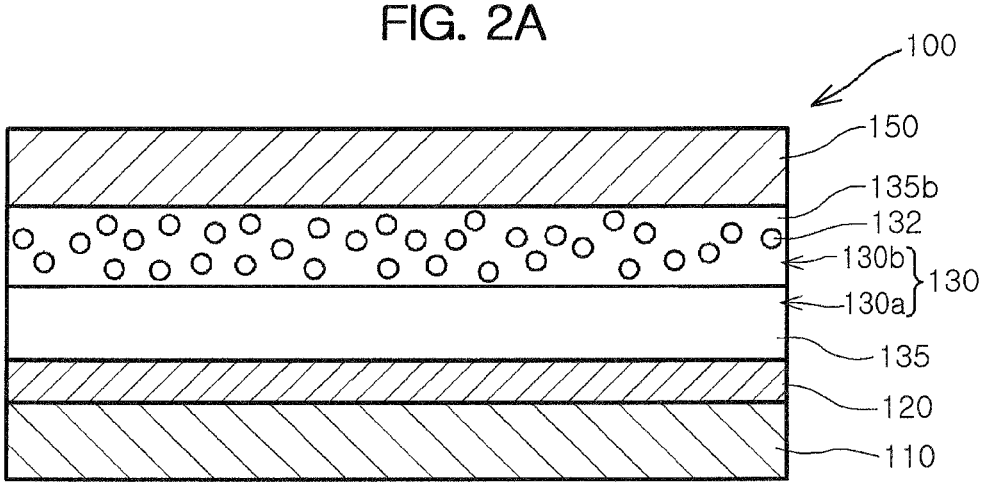
Figure 2C:
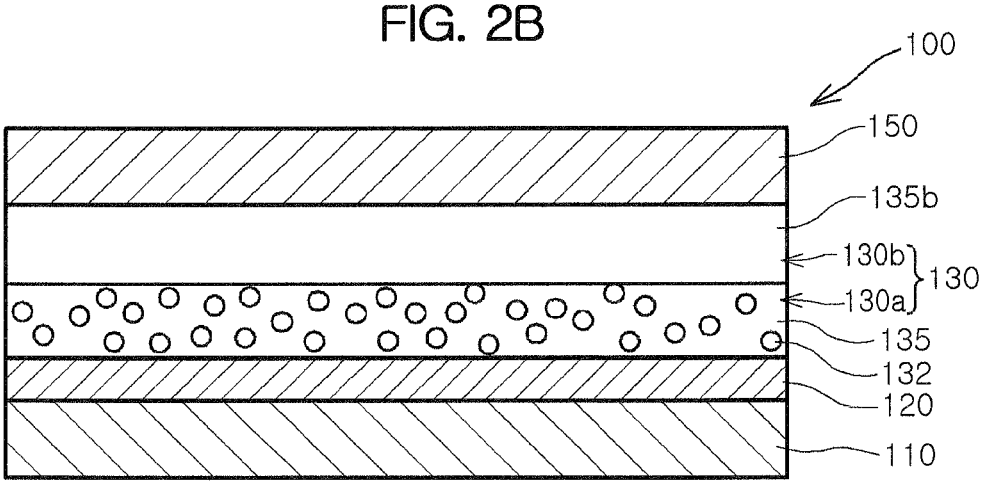
Figure 3:
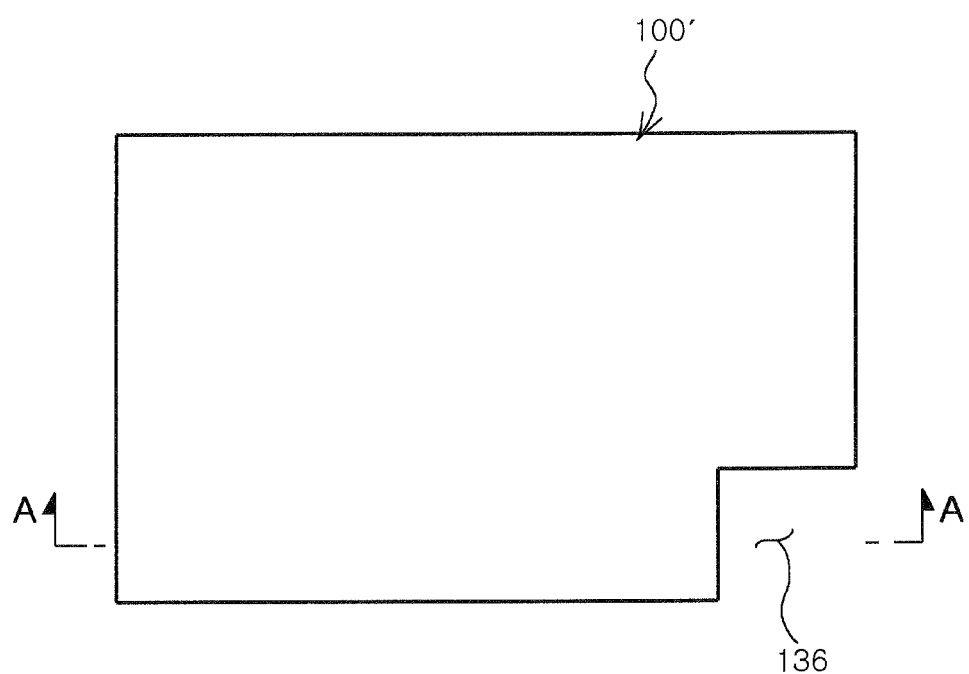
FIGS. 3 and 4 illustrate a structure according to variation examples of the phosphor film of FIG. 1.
Figure 4:
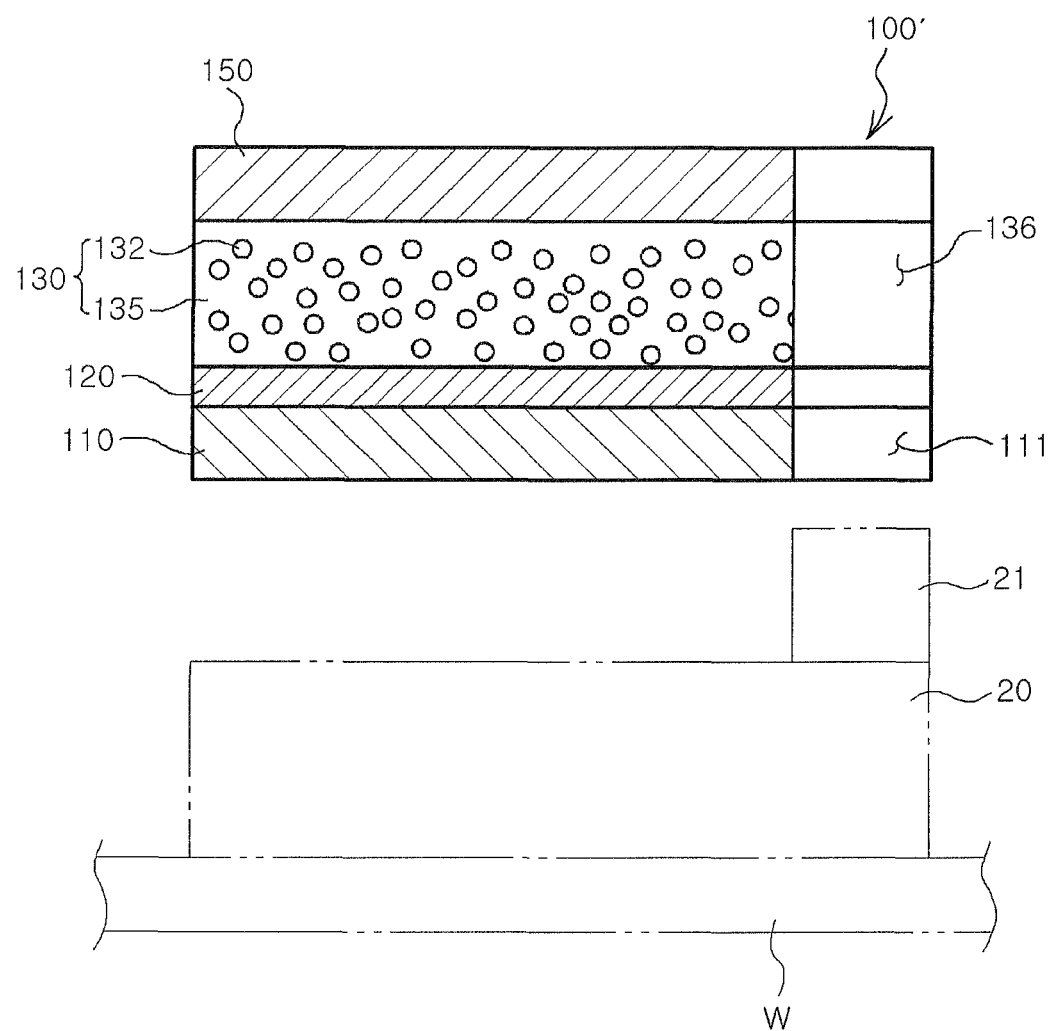

FIG. 1 illustrates a structure of a phosphor film according to an embodiment of the present invention. FIGS. 2A through 2C schematically illustrate a structure of a phosphor layer in the phosphor film of FIG. 1. FIGS. 3 and 4 illustrate a structure according to variation examples of the phosphor film of FIG. 1.

With reference to FIGS. 1 to 4, a phosphor film 100 according to an embodiment of the present invention may include a base film 110, a phosphor layer 130 formed on the base film 110, and a cover film 150 protecting the phosphor layer 130. The phosphor film 100 may further include a temporary adhesive layer 120 formed between the base film 110 and the phosphor layer 130.

The base film 110 may be provided to serve as a carrier of the phosphor layer 130. As a material of the base film 110, a general polymer material such as PVC, Polyolefin, PET, PI, or the like, may be used. In addition, the base film 110 may be formed of an expandable material, and in this case, for example, polyolefin may be used. In a case in which heat resistance is required, a PI-based polymer material may be used.

The temporary adhesive layer 120 may be provided to easily reduce adhesive force when, for example, the phosphor layer 130 is first adhered to the base film 110 while maintaining the adhesive force therebetween and then the phosphor layer 130 needs to be separated from the base film 110 in order to coat a light emitting diode (LED) chip with the phosphor layer 130 at the time of a packaging process. The temporary adhesive layer 120 may be selectively applied as needed, according to a process, and may not necessarily be required. The temporary adhesive layer 120 may be formed of a material having properties that it initially has adhesive properties but loses the adhesive properties when a constituent material is cured by heat or ultraviolet (UV) in a subsequent process. As a material of the temporary adhesive layer 120, a material obtained by mixing, for example, a polymer-based resin and an ultraviolet curable polymer, may be used, and in this case, the adhesive force may be reduced by the irradiation of ultraviolet light. As an ultraviolet curable polymer, an acrylic-based resin or the like may be used. The temporary adhesive layer 120 may have a thickness in a range of several pm to several tens of μm.

The phosphor layer 130 may be formed of a material obtained by mixing phosphor particles in a partially cured resin material. For example, phosphor particles 132 may be mixed in a polymer binder 135 including a resin, a curing agent, a curing catalyst and the like, such that a partially cured (B-stage cured) compound material may be obtained. In the phosphor particles 132, a garnet-based phosphor of YAG, TAG and LuAG, a silicate-based phosphor, a nitride-based phosphor, a sulfide-based phosphor, an oxide-based phosphor, or the like, may be used, which may be configured as a mono phosphor or a poly-phosphor mixed in a predetermined ratio. A resin used in the phosphor layer 130 may be a resin material satisfying conditions of high adhesion, high light transmission, high heat resistance, a high light refractive index, moisture resistance, and the like, and silicon, an epoxy-based or inorganic polymer, may generally be used. In order to secure relatively high adhesion, an additive for improving adhesion, for example, a silane-based material may be used. The phosphor layer 130 may be coated on the base film 110 in a liquid state and may be then subjected to a drying and partial curing process such that a layer having a solid state is obtained therefrom at a normal temperature. When heat is applied to the phosphor layer 130 in a partially cured state, a phase change may occur such that the phosphor layer may have a state of a movable extent. This state change may be usefully applied in an LED packaging process to be described below. The phosphor layer 130 may be coated on an object to be required and remaining curing may be then performed through subsequent additional curing such that a completely cured solid structure may be obtained. In order to perform the process described above, the phosphor layer 130 may have a modulus value of about 100 Mpa or higher at normal temperature and may have a modulus value of about 20 MPa or less at about 65° C. or more. In more detail, in the phosphor layer, a modulus value in a temperature range of 0° C. to 25° C. may be between about 100 Mpa or higher and about 500 Mpa or less, and a modulus value in a temperature range of 60° C. to 80° C. may be between about 0.5 Mpa or higher and about 3 Mpa or less. More specifically, in the phosphor layer 130, the modulus value at about 80° C. may have a value of 10% or less of the modulus value at about 25° C. An appropriate modulus value may be determined according to an object through which the phosphor layer 130 having occurrence of mobility is to penetrate, for example, a thickness or rigidity of a wire of a wire-bonded LED chip. In general, a case in which an amount of modulus change based on a change in temperature is relatively great may be used in the process. Physical properties as described above may improve cutting performance when there is a need to cut the phosphor layer 130 in a predetermined standard in advance at the time of manufacturing the phosphor film 100. In addition, at relatively high temperature at the time of a packaging process, the physical properties as described above may provide a condition that transformation of a wire does not occur even in a case of, for example, pressing a wire-bonded LED chip from an upper part thereof. In order to secure the physical properties described above, a resin material may be obtained by mixing a thermoplastic resin in a thermosetting resin or a silicon resin.

FIG. 2 schematically illustrates a structure of the phosphor layer 130 in the phosphor film 100. The phosphor layer 130 may be formed of a single layer as shown in FIG. 1 and formed of a plurality of layers stacked therein as shown in FIG. 2. In detail, the phosphor layer 130 may have a stacked structure in which a first layer 130a is formed on the base film 110 and a second layer 130b is formed on the first layer 130a. Although the present embodiment provides a case in which the phosphor layer has two stacked layers, three or more layers may be included in the phosphor layer. Respective layers 130a and 130b may be obtained by mixing phosphor particles in partially cured resin materials 135a and 135b. Here, resin materials of respective layers may have different properties. For example, the resin material 135a forming the first layer 130a may have greater strength than the resin material 135b forming the second layer 130b, such that the phosphor layer 130 is maintained to have a stable form. In addition, the resin material 135b forming the second layer 130b may have higher adhesive force than the resin material 135a forming the first layer 130a, such that adhesion to a light emitting device 20 may be easily performed.

Any one of the first and second layers may be formed of a transparent layer. In detail, as shown in FIG. 2B, the first layer may be formed of a transparent layer that does not contain the phosphor particles 132, and the second layer may only contain the phosphor particles 132. In addition, as shown in FIG. 2C, the first layer 130a may only contain the phosphor particles 132, while the second layer 130b may not contain the phosphor particles 132.

Meanwhile, the phosphor layer 130 may include a receiving hole 136 receiving an electrode 21 of the light emitting device 20 wire-bonded to a wire as shown in FIGS. 3 and 4. The receiving hole 136 may be formed to have a structure in which it penetrates the phosphor layer 130 so as to correspond a position and a structure of the electrode 21 of the light emitting device 20. Therefore, even in a case in which the phosphor layer 130 is located on the light emitting device 20 at the time of a packaging process, the electrode 21 of the light emitting device 20 may be received in the receiving hole 136 such that the electrode 21 is not covered with the phosphor layer 130 but is exposed to the outside. Then, the electrode 21 may be stably bonded to the wire, and thus, at the time of a packaging process, transformation of the wire may be prevented. That is, the structure of the phosphor layer 130 shown in FIG. 1 may be differentiated from that of the phosphor layer 130 shown in FIGS. 3 and 4 in that in FIG. 1, the coating is performed by pressing the wire-bonded light emitting device 20 together with the wire, while in FIGS. 3 and 4, the wire bonding process is performed in a state in which the light emitting device 20 is only coated. As shown in FIGS. 1 to 4, in the case in which the phosphor layer 130 includes the receiving hole 136 formed therein, the base film 110 may have a through hole 111 formed to correspond to the receiving hole 136, to thus provide a structure in which the phosphor film 100' is overall penetrated thereby. Although the case in which a single electrode 21 is formed on the light emitting device 20 is described with reference to the accompanying drawings, the present invention is not limited thereto. That is, in the electrode structure as described above, a plurality of electrodes may be applied thereto, and in this case, the receiving hole 136 may be provided in plural to correspond to the plurality of electrodes. The receiving hole 136 and the through hole 111 may be formed through punching or laser irradiation or through etching. Here, the light emitting device 20 may include an LED chip having a semiconductor layer and an active layer, and at least one electrode may be formed on an upper surface of the light emitting device.

The phosphor layer 130 may further include a spacer (not shown). The spacer may allow for a coating thickness to be maintained at an appropriate level when the phosphor layer 130 is coated on a target object, and thus, the spacer may have a size equal to a thickness of coating to be performed. An amount of a spacer occupied in the phosphor layer 130 may be several percent (%) or less thereof. In order to prevent reduction in light properties, the spacer may be formed of an inorganic or an organic material significantly excellent in terms of light transmissivity. Alternatively, in order to reflect light from a spacer surface, an inorganic or an organic material having a surface coated with a reflective layer having relatively high reflectance may be used.

The cover film 150 may be formed of a general polymer material, PVC, polyolefin, PET, PI, or the like, in a similar manner to the base film 110. A releasing agent may be coated on a surface on which the phosphor layer 130 is adhered to the cover film 150, such that the cover film 150 is easily separated from the phosphor layer 130. The cover film 150 may be selectively applied as needed in a process and may not necessarily be applied thereto.

Figure 5:
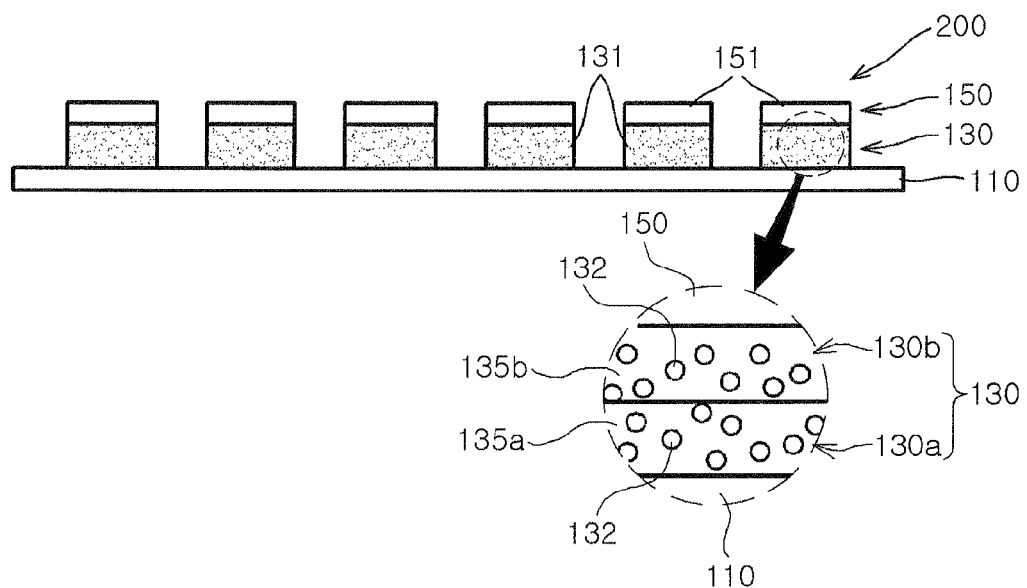
FIG. 5 illustrates a structure of a phosphor film according to another embodiment of the present invention.

FIG. 5 illustrates a structure of a phosphor film 200 according to another embodiment of the present invention. The phosphor film 200 according to the embodiment of the present invention may have a structure in which the phosphor layer 130 is cut in advance, based on a predetermined standard. That is, the phosphor layer 130 may include a plurality of phosphor strips 131 having a predetermined size and spaced apart from one another by a predetermined interval. Similarly, the respective phosphor strips 131 forming the phosphor layer 130 may be formed as a single layer or formed of a plurality of layers stacked therein as shown in FIG. 2. In addition, the cover film 150 may include a plurality of cover film strips 151 having a size corresponding to that of the phosphor strips 131. The size of the phosphor strips 131 or an interval therebetween may be determined to be appropriate for a target object to be coated with the phosphor strips 131. For example, in the case of being applied to a substrate on which a plurality of light emitting devices are arrayed, the size of the phosphor strips 131 or an interval therebetween may be determined according to the size of the light emitting device and an interval between the arrayed light emitting devices. The plurality of phosphor strips 131 may be arrayed in a single direction in one dimension or in two dimensions. In addition, although not shown in FIG. 5, the receiving holes 136 as in FIG. 3 may be respectively formed in the plurality of phosphor strips 131 to correspond to a position of an electrode included in the light emitting device.

Figure 6:
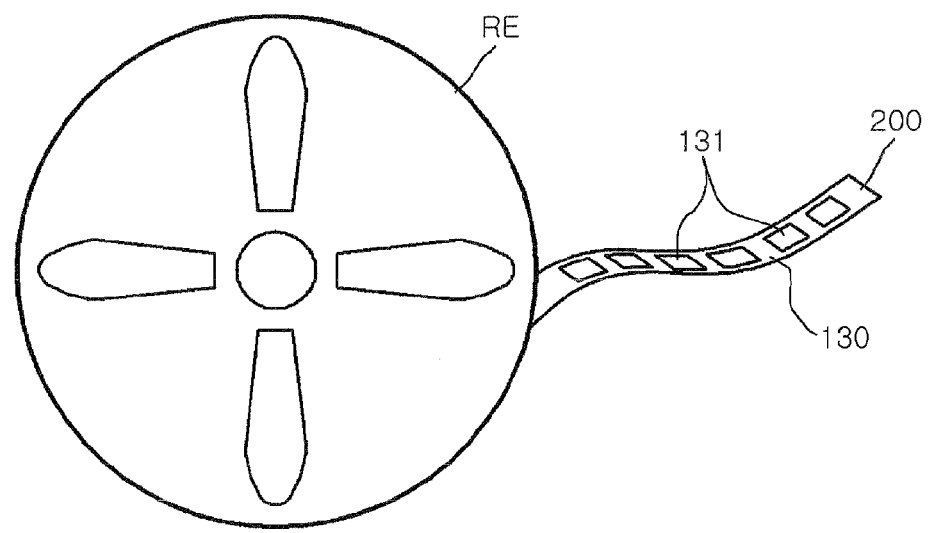
FIG. 6 illustrates an example in which the phosphor film of FIG. 5 is stored.

FIG. 6 illustrates an example in which the phosphor film of FIG. 5 is stored. The phosphor film 200 may be in strip form and be a reel type film so as to facilitate the storage thereof. The phosphor film 200 may be kept in a partially cured state at normal temperature, and at the time of being used, heat may be applied to necessary numbers of phosphor strips 131 such that they may be coated on a target object. Although the case in which the phosphor strips 131 are arrayed on the phosphor film 200 in one dimension is illustrated by way of example, the present invention is not limited thereto.

Figure 7:
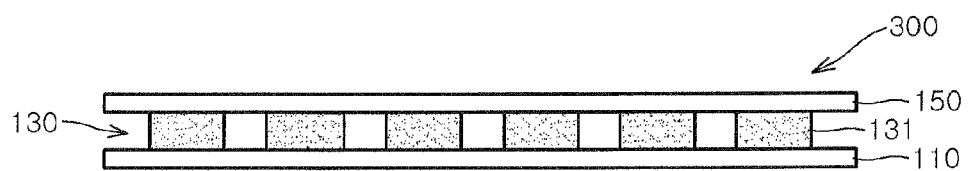
FIG. 7 illustrates a structure of a phosphor film according to another embodiment of the present invention.

FIG. 7 illustrates a structure of a phosphor film 300 according to another embodiment of the present invention. The phosphor film 300 according to the present embodiment may be differentiated from the phosphor film 200 according to the embodiment of FIG. 5, in that in the phosphor film 300 according to the present embodiment, the phosphor layer 130 includes a plurality of phosphor strips 131 having a predetermined size and spaced apart from one another by a predetermined interval, and the cover film 150 is formed of a single film overall covering the plurality of phosphor strips 131. The phosphor strips 131 may be arrayed in one dimension or in two dimensions. The phosphor film 300 according to the present embodiment may also be kept in a reel type in the similar manner to FIG. 6, and at the time of being used, the cover film 150 may be separated from the phosphor film 300. Similarly, although not shown in FIG. 7, the plurality of phosphor strips 131 may be formed of a plurality of layers as shown in FIG. 2, and the respective phosphor strips 131 may respectively have the receiving holes 136 as in FIGS. 3 and 4, to correspond to a position of an electrode included in the light emitting device.

Figure 8:
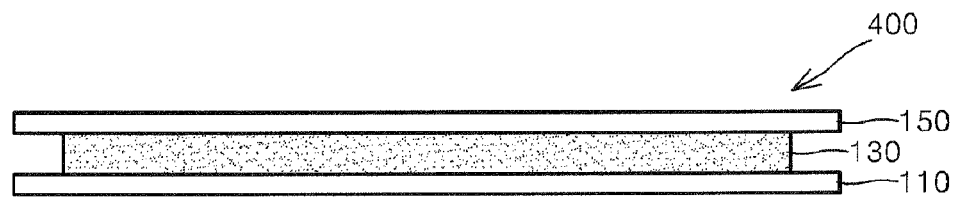
FIG. 8 illustrates a structure of a phosphor film according to another embodiment of the present invention.

FIG. 8 illustrates a structure of a phosphor film 400 according to another embodiment of the present invention. In the present embodiment, the base film 110, the phosphor layer 130 and the cover film 150 may be respectively formed of a single film. The phosphor film 400 may have strip form as a reel-type film so as to facilitate the storage thereof as shown in FIG. 6. Similarly, the phosphor layer 130 may be formed of a plurality of layers as shown in FIG. 2, and in the phosphor layer 130, the receiving hole 136 as in FIGS. 3 and 4 may be formed to correspond to a position of an electrode included in each light emitting device according to a position of an LED chip and an interval between the arrayed LED chips. During use, the cover film 150 may be separated from the phosphor layer 130.

Figure 9:
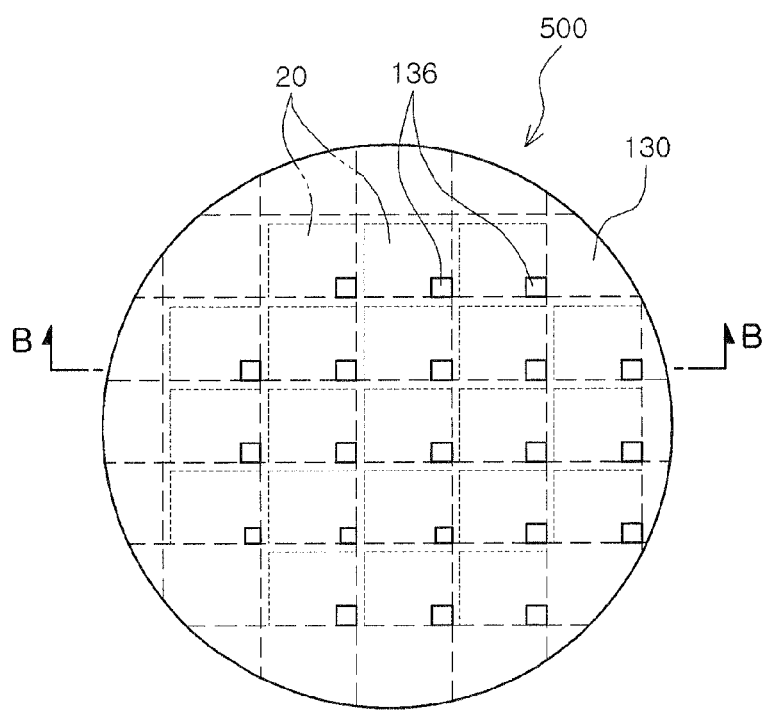
FIGS. 9 and 10 schematically illustrate a structure of a phosphor film according to another embodiment of the present invention.
Figure 10:
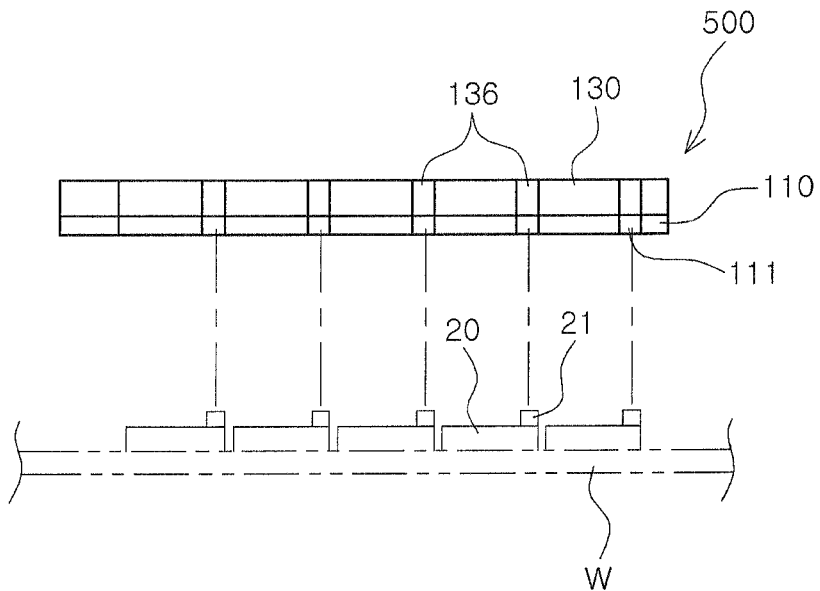

FIGS. 9 and 10 schematically illustrate a structure of a phosphor film 500 according to another embodiment of the present invention. In the present embodiment, the phosphor film may have a form corresponding to an overall form of the wafer W so as to be entirely covered in a wafer level state, that is, before a plurality of light emitting devices 20 grown on the wafer W through a chemical vapor deposition (CVD) device or the like are divided into individual chips, respectively. In addition, a plurality of receiving holes 136 may be provided to respectively correspond to positions of the electrodes 21 on the respective light emitting devices 20 according to an interval between a plurality of light emitting devices 20 arrayed on the wafer. Similarly, the phosphor layer 130 may be formed of a plurality of layers as shown in FIG. 2, and the base film 110 may include a through hole 111 to correspond to a position of the receiving hole 136 formed in the phosphor layer 130. In a case in which the cover film 150 is provided, the cover film 150 may be separated from the phosphor layer 130 at the time of being used.

Physical properties of the phosphor layer 130 described with reference to FIG. 5 and FIGS. 7 to 10 are the same as those described with reference to FIGS. 1 and 2. In addition, although not shown FIG. 5 and FIGS. 7 to 10, a temporary adhesive layer may be selectively, further provided between the phosphor layer 130 and the base film 110. Processes of using the temporary adhesive layer may have a slight difference according to a detailed form of the phosphor films 200, 300, 400 and 500.

Hereinafter, a method of manufacturing a phosphor film according to an embodiment of the present invention will be described. Manufacturing methods to be described below are methods in which a phosphor layer formed of a material obtained by mixing phosphor particles in a partially cured resin material is formed on a base film. A method of manufacturing a phosphor film in which a phosphor layer is configured of a plurality of phosphor strips spaced apart from one another will be described by way of an example.

FIGS. 11 to 15 illustrate a method of manufacturing a phosphor film according to an embodiment of the present invention.

Figure 11:
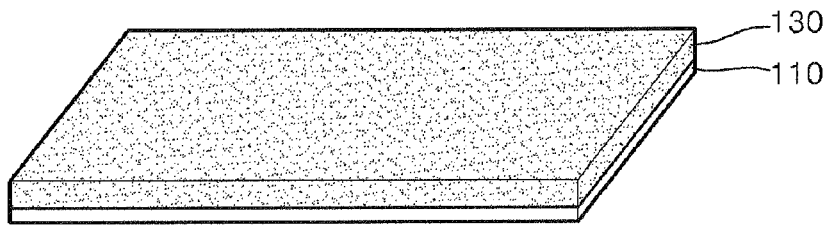
FIGS. 11 to 15 illustrate a method of manufacturing a phosphor film according to an embodiment of the present invention.

With reference to FIG. 11, the phosphor layer 130 may be formed on the base film 110. The base film 110 may be formed of an expandable polymer material. The phosphor layer 130 may be formed of a material obtained by mixing phosphor particles in a partially cured resin material, may be in a partially cured state at normal temperature and may have a phase change to be movable upon being heated. The phosphor layer 130 according to the present embodiment may have substantially the same structure as the phosphor layer 130 described with reference to FIGS. 1 and 2.

Figure 12:
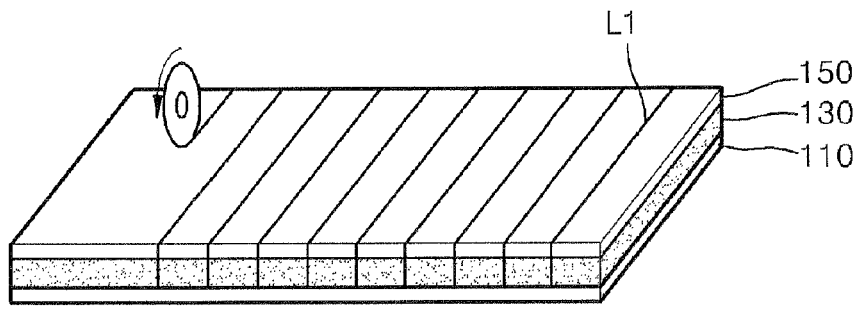

With reference to FIG. 12, the cover film 150 may be formed on the phosphor layer 130. Here, a temporary adhesive layer (not shown) may be formed on a surface on which the cover film 150 is to be adhered to the phosphor layer 130, and in this case, the cover film 150 may then be adhered to the phosphor layer 130, having the temporary adhesive layer therebetween. Subsequently, the cover film 150 and the phosphor layer 130 may be cut, for example, along a plurality of first cutting lines L1 provided in line.

Figure 13:
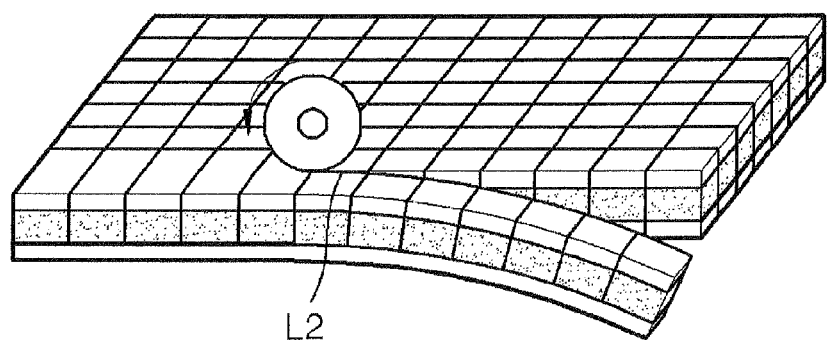

Then, with reference to FIG. 13, the cover film 150, the phosphor layer 130 and the base film 110 may be cut, for example, along a second cutting line L2 perpendicular to the first cutting line L1.

Figure 14:
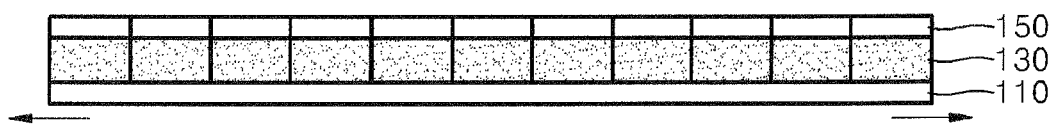
Figure 15:
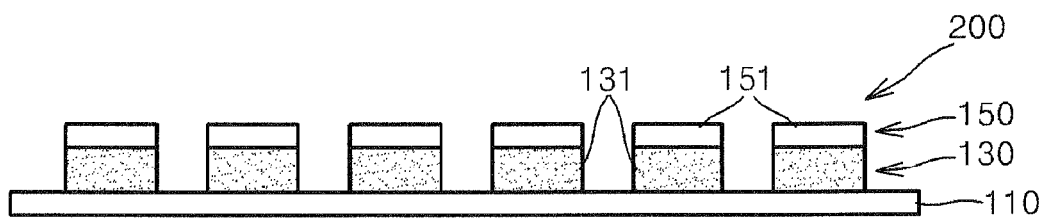

FIG. 14 illustrates a strip shape formed through the cutting process described above. Then, the base film 110 may be expanded in both lateral directions, left and right. Accordingly, the phosphor film 200 may be manufactured in such a manner that the phosphor layer 130 is divided into the plurality of phosphor strips 131 and the cover film 150 is divided into the plurality of cover film strips 151, as shown in FIG. 15. The manufactured phosphor film 200 may be easily kept as a reel-type film as shown in FIG. 16.

FIGS. 16 to 22 illustrate a method of manufacturing a phosphor film according to another embodiment of the present invention.

Figure 16:
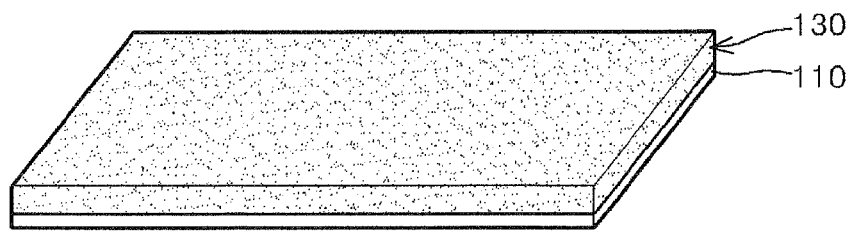
FIGS. 16 to 22 illustrate a method of manufacturing a phosphor film according to another embodiment of the present invention.

First, as shown in FIG. 16, the phosphor layer 130 may be formed on the base film 110. The base film 110 may be formed of an expandable polymer material. The phosphor layer 130 may be formed of a material obtained by mixing phosphor particles in a partially cured resin material, may be in a partially cured state at normal temperature and may have a phase change to be movable upon being heated. The phosphor layer 130 according to the present embodiment may have substantially the same structure as the phosphor layer 130 described with reference to FIGS. 1 and 2.

Figure 17:
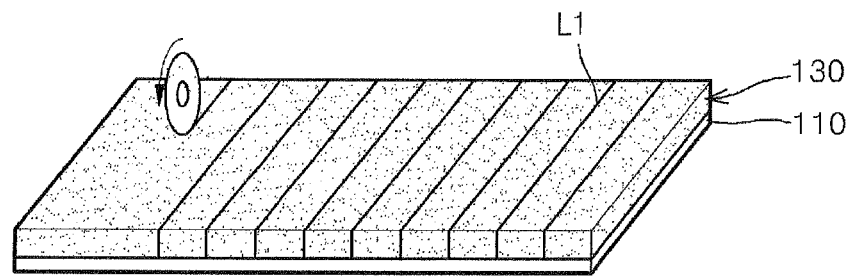
Figure 18:
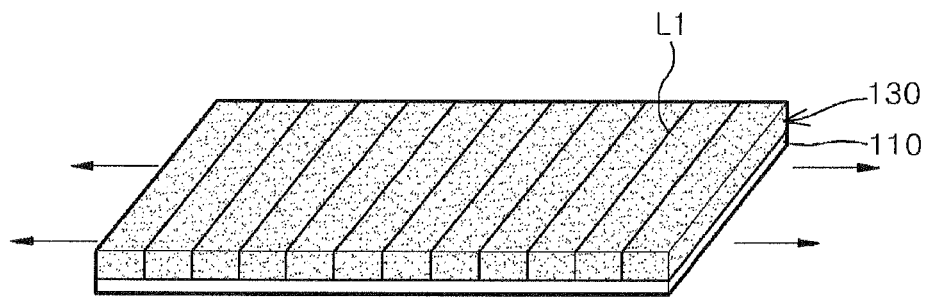
Figure 19:
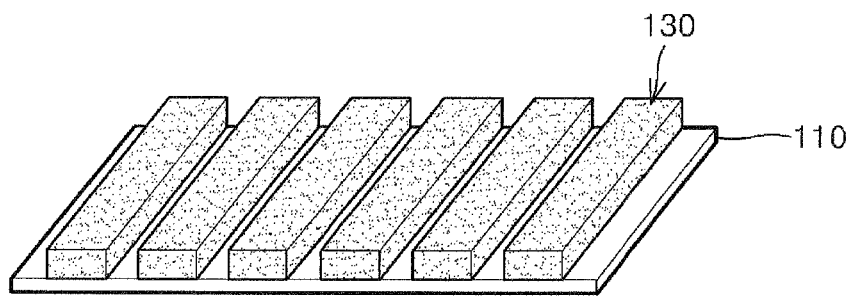

Then, as shown in FIG. 17, the phosphor layer 130 may be cut along the first cutting line L1, and as shown in FIG. 18, the base film 110 may be expanded in both lateral directions, left and right. Therefore, the phosphor layer 130 may be divided into a plurality of regions through the first cutting line L1 as shown in FIG. 19.

Figure 20:
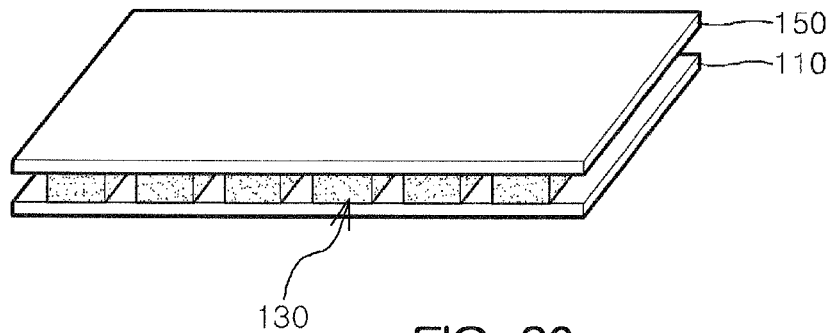

Subsequently, the cover film 150 may be formed above the phosphor layer 130 as shown in FIG. 20. A temporary adhesive layer (not shown) may also be further formed on a surface on which the cover film 150 is to be adhered to the phosphor layer 130.

Figure 21:
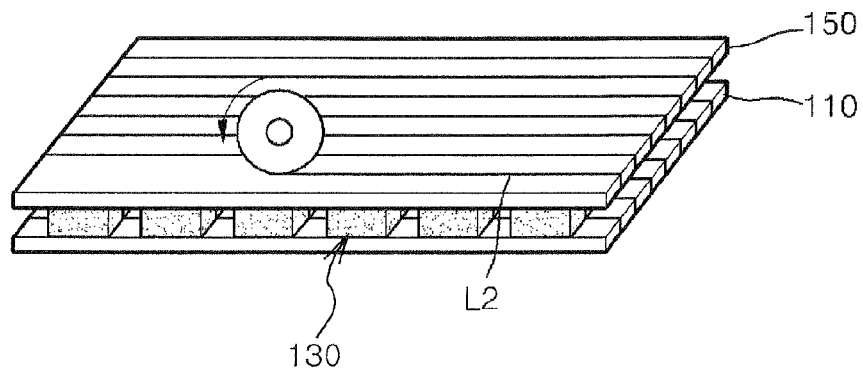
Figure 22:
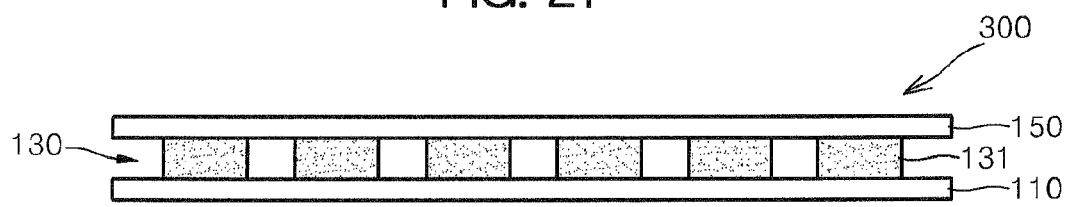

Next, the cover film 150, the phosphor layer 130 and the base film 110 may be cut along the second line L2 perpendicular to the first cutting line L1 as shown in FIG. 21, such that a phosphor film 300 as illustrated in FIG. 22 is manufactured. The manufactured phosphor film 300 may be kept as a reel-type film as shown in FIG. 6.

FIGS. 23 to 27 illustrate a method of manufacturing a phosphor film according to another embodiment of the present invention.

Figure 23:
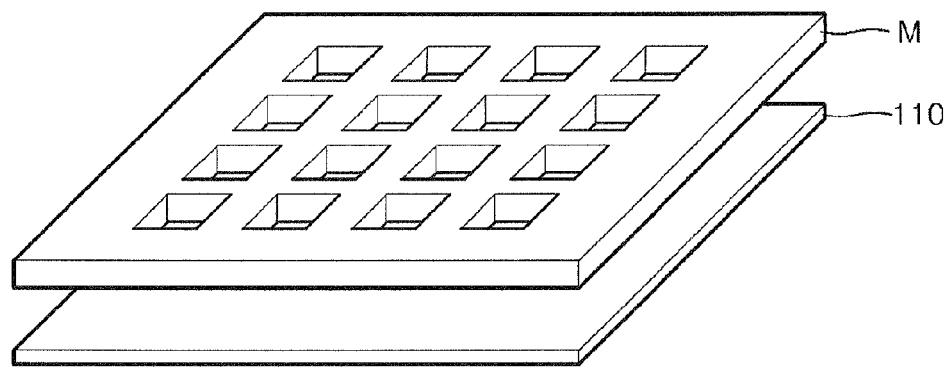
FIGS. 23 to 27 illustrate a method of manufacturing a phosphor film according to another embodiment of the present invention.

With reference to FIG. 23, a mask M having a plurality of holes formed therein may be disposed above the base film 110. The size of the plurality of holes and an interval therebetween may be determined according to the size of phosphor strips to be manufactured and an interval therebetween.

Figure 24:
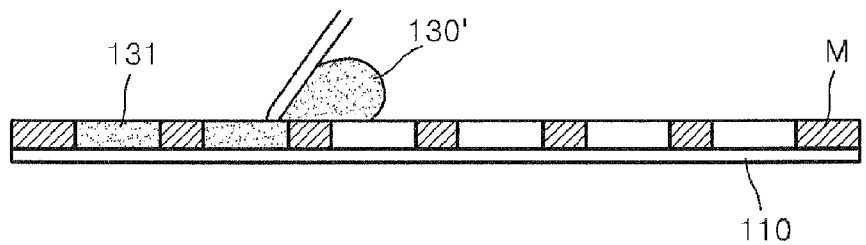
Figure 25:
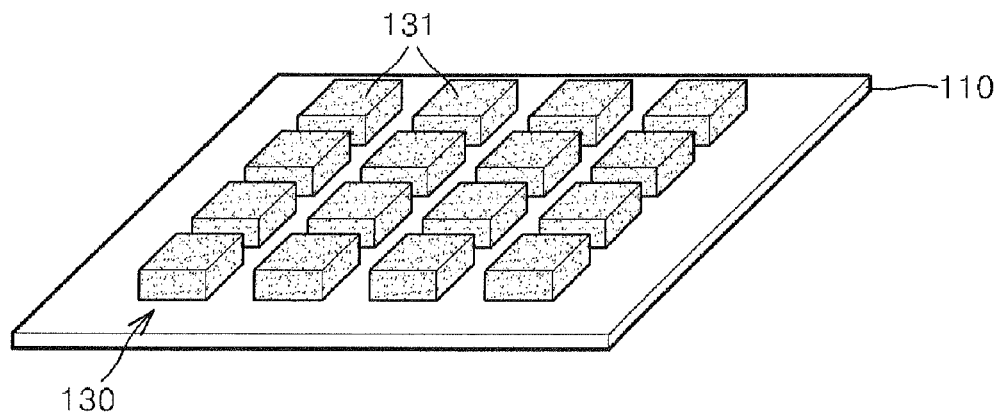

Then, as shown in FIG. 24, a paste 130' obtained by mixing phosphor particles in a partially cured resin material may be printed using the mask M. Thus, the phosphor layer 130 having a structure in which the phosphor strips 131 are disposed on positions corresponding to the holes formed in the mask M may be formed as shown in FIG. 25. FIG. 25 illustrates the case in which a single phosphor layer 130 is printed and formed, but the present invention is not limited thereto, and a phosphor layer having a multilayered structure may be used as shown in FIG. 2. That is, the phosphor layer may be formed by printing a first layer 130a using the mask M and a second layer 130b may then be printed on the first layer 130a.

Figure 26:
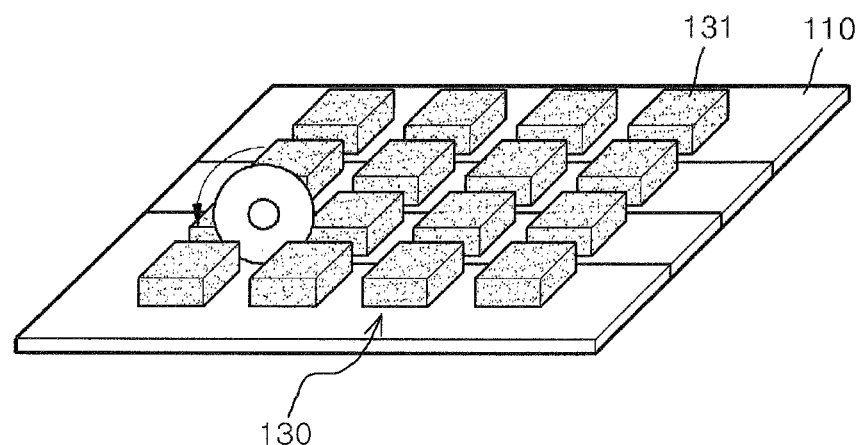
Figure 27:
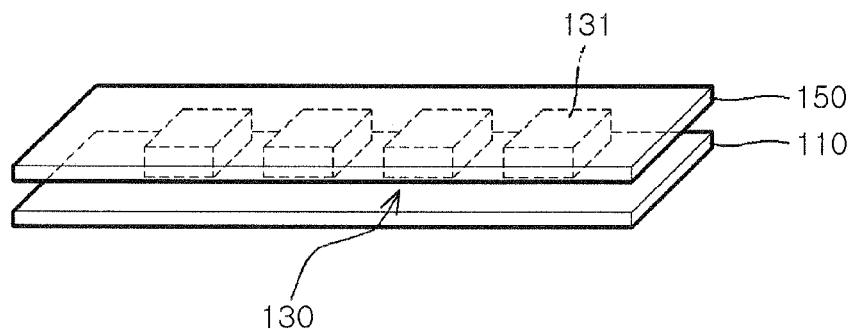

Then, the structure of FIG. 25 may be cut in strip form as shown in FIG. 26, and the cover film 150 may be formed on the cut phosphor layer 130 as shown in FIG. 27. The manufactured phosphor film may be kept as a reel-type film as shown in FIG. 6.

Figure 28A:
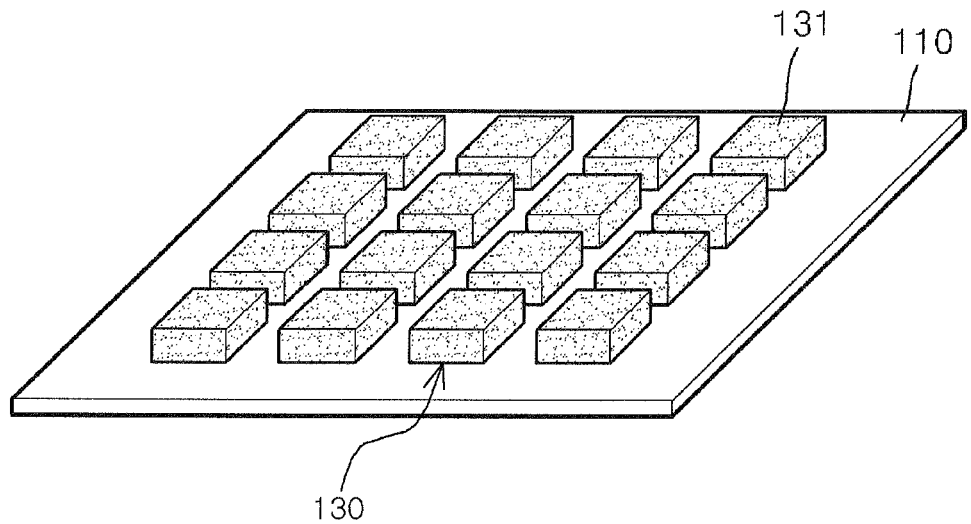
FIGS. 28A and 28B illustrate a method of manufacturing a phosphor film according to another embodiment of the present invention.
Figure 28B:
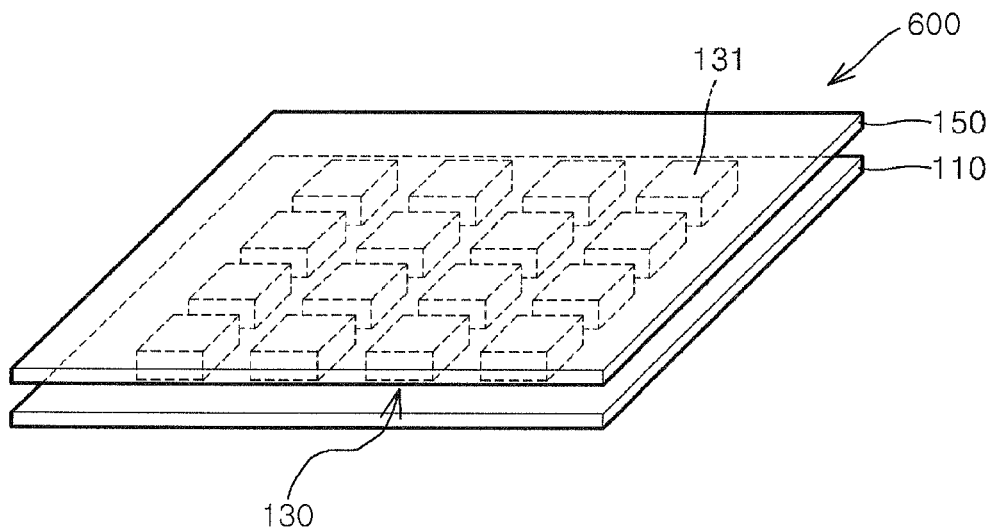

FIGS. 28A and 28B illustrate a method of manufacturing a phosphor film according to another embodiment of the present invention. FIG. 28A illustrates a structure as illustrated in FIG. 25, and as shown in FIG. 28B, the cover film 150 may be formed on the phosphor layer 130. A phosphor film 600 as illustrated in FIG. 28B may have a form appropriate for simultaneously coating a plurality of LED chips with the phosphor layer 130. The number of the phosphor strips 131 or disposition thereof may be appropriately determined according to the disposition of a plurality of LED chips to be coated with the phosphor layer 130.

Hereinafter, a method of coating a light emitting device with a phosphor material will be described. Embodiments of the present invention to be described below commonly include processes in which a phosphor film including a phosphor layer formed by mixing phosphor particles in a partially cured resin material is prepared, heat is applied to the phosphor layer to generate mobility therein, and the phosphor layer having the generated mobility is pressed and adhered to the vicinity of the light emitting device, by way of examples.

FIGS. 29 to 32 illustrate a method of coating a light emitting device with a phosphor layer according to an embodiment of the present invention. The present embodiment provides a pickup and pressing method, a coating method using the phosphor film 200 manufactured as illustrated in FIG. 15.

Figure 29:
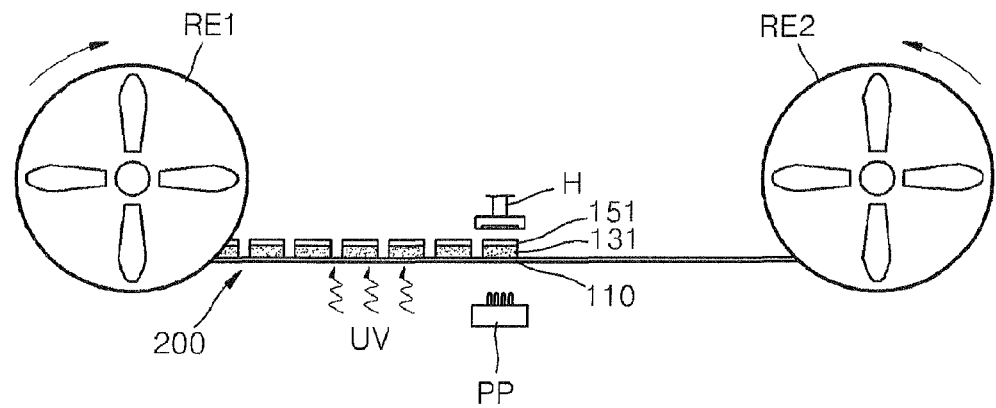
FIGS. 29 to 32 illustrate a method of coating a light emitting device with a phosphor layer according to an embodiment of the present invention.

First, FIG. 29 is a schematic view illustrating a supplier reel RE1 supplying the phosphor film 200, a pickup head H and a pushpin PP lifting the phosphor strips 131 and the cover film strips 151 from the base film 110, and a collector reel RE2 collecting the base film 110. In a case in which a temporary adhesive layer (not shown) is formed between the base film 110 and the phosphor strips 131, ultraviolet (UV) light may be emitted before the pickup operation in order to reduce adhesion.

Figure 30:
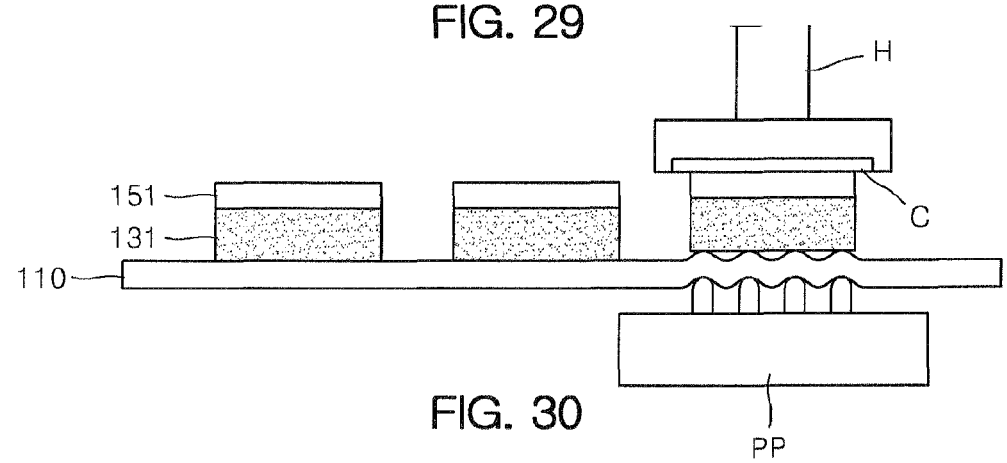

FIG. 30 illustrates a pickup operation. The pushpin PP and the pickup head H may be disposed to have the phosphor film 200 interposed therebetween. The pushpin PP serves to press the base film upwardly. The pickup head H may include a collet C contacting a target object. A surface of the collet C may be provided with a plurality of micro conduits (not shown), such that a target object may be temporarily captured in a pressure reduced state through vacuum conduits (not shown) formed in the pickup head H. The collet C may be formed of rubber, a metal, a heat resistant engineering plastic material, or the like.

Figure 31:
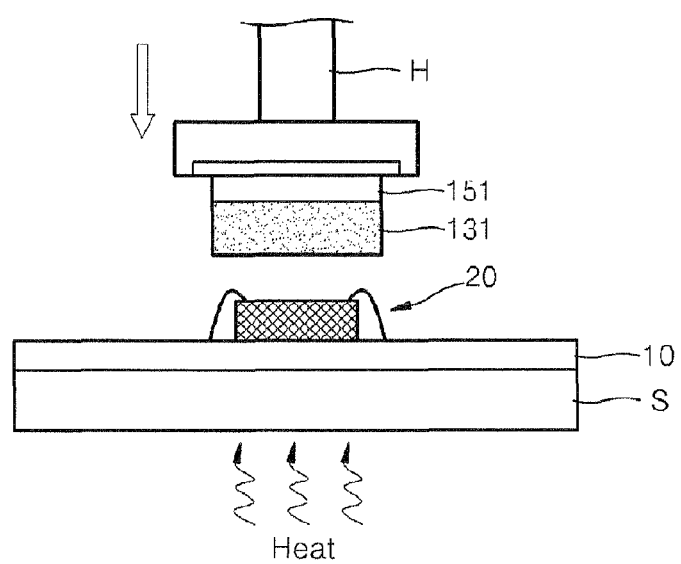
Figure 32:
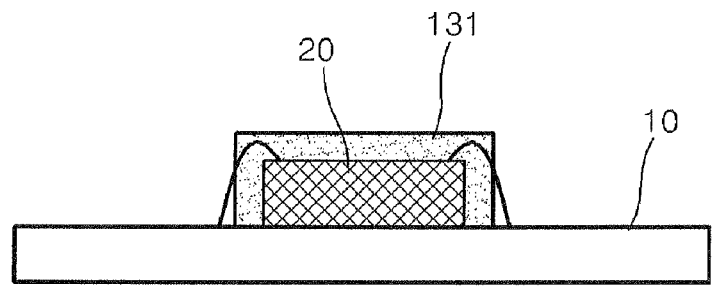

FIG. 31 illustrates an operation of pressing and adhering the lifted phosphor strips 131 to the vicinity of the light emitting device 20. In order to apply heat to the phosphor strips 131, a substrate 10 to which an LED chip 20 is wire-bonded may be disposed on a heating stage S. As the cover film strip 151 and the phosphor strip 131 are closer to the light emitting device 20, the phosphor strip 131 may have mobility due to heat, and the phosphor strip 131 may then penetrate the light emitting device 20 and a wire such that it coats the vicinity of the light emitting device 20 as shown in FIG. 32.

Figure 33A:
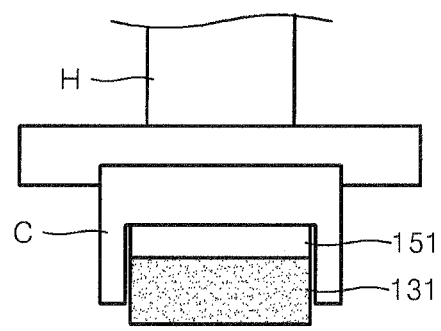
FIGS. 33A and 33B schematically illustrate a structure of a pickup head used in the embodiment of FIGS. 29 to 32 by way of example.
Figure 33B:
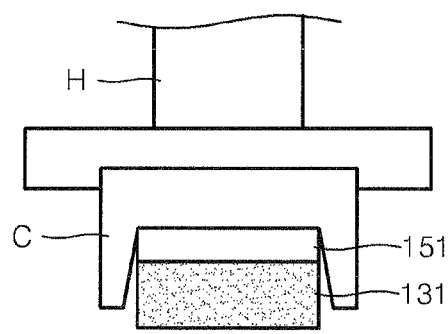

FIGS. 33A and 33B illustrate a structure of the collet C mounted on the pickup head H used in the embodiment of FIGS. 29 to 32 by way of example. Although FIG. 29 illustrates the case in which the collet C is used as a flat type collet, a cavity type collet may be employed as shown in FIGS. 33A and 33B. Such a cavity type collet may serve as a frame allowing a uniform form to be maintained when the cover film strip 151 and the phosphor strip 131 are lifted thereby. A depth of the cavity may be deeper than a thickness of the cover film strip 151 but smaller than the sum of thicknesses of the cover film strip 151 and the phosphor strip 131. An inclination of an inner wall of the cavity may be at a right angle, as shown in FIG. 33A, or at an obtuse angle, as shown in FIG. 33B.

Figure 34:
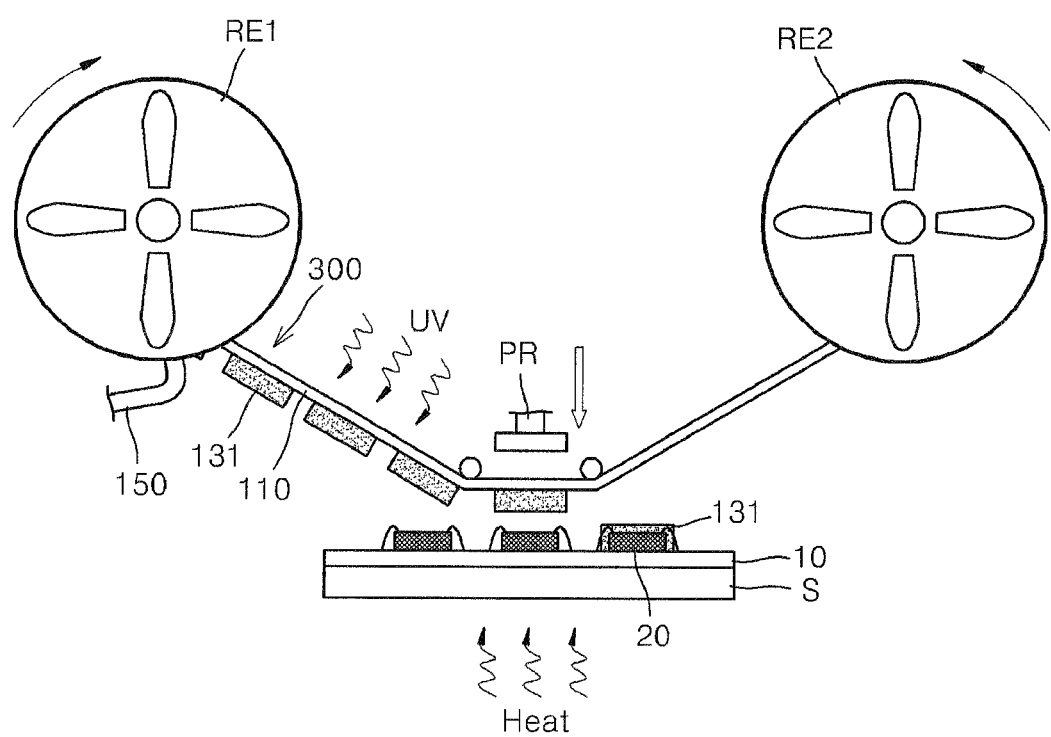
FIG. 34 illustrates a method of coating a light emitting device with a phosphor layer according to another embodiment of the present invention.

FIG. 34 illustrates a method of coating a light emitting device with a phosphor layer according to another embodiment of the present invention. The present embodiment provides a direct pressing method, a coating method using the phosphor film 300 having a form as illustrated in FIG. 22. The phosphor film 300 may be provided from the supplier reel RE1, and here, the cover film 150 may be separated, prior to the supply of the phosphor film 300 from the supplier reel RE1. The phosphor film 300 provided from the supplier reel RE1 may be disposed such that the phosphor strips 131 face the light emitting devices 20. The substrate 10 to which the light emitting devices 20 are wire-bonded may be disposed on the heating stage S, and pressure may be applied to a surface different from a surface of the base film 110 on which the phosphor strips 131 are disposed. As the phosphor strip 131 is closer to the light emitting device 20, the phosphor strip 131 may have mobility generated therein due to heat, and the phosphor strip 131 may then penetrate the light emitting device 20 and the wire such that it coats the vicinity of the light emitting device 20. A portion of the base film 110 from which the phosphor strip 131 has been removed may be collected by the collector reel RE2.

Figure 35A:
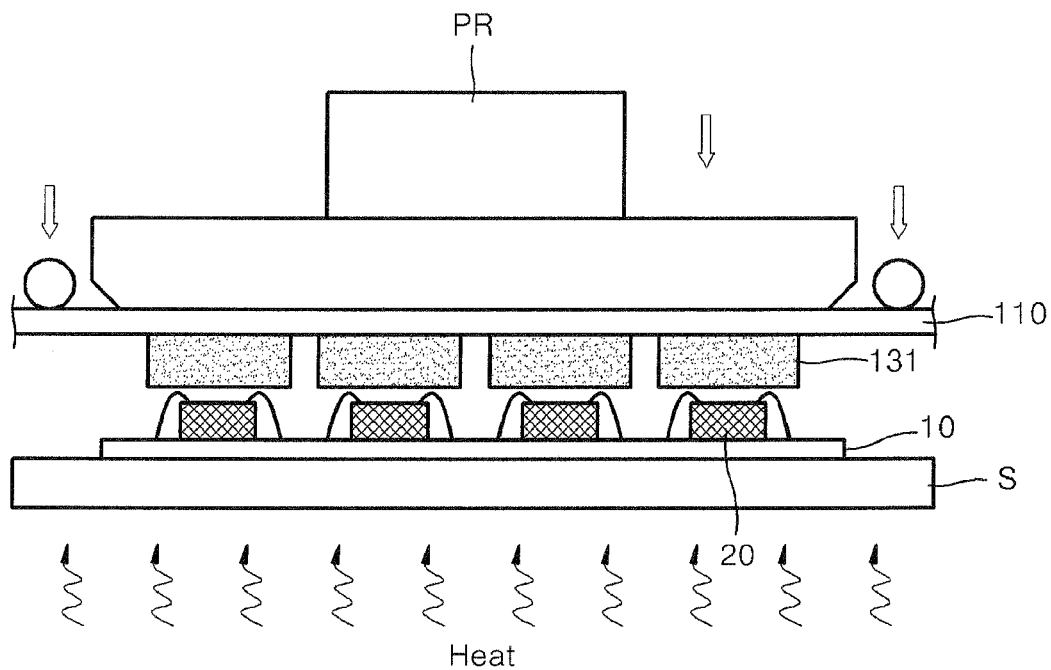
FIGS. 35A and 35B illustrate a method of coating a light emitting device with a phosphor layer according to another embodiment of the present invention.
Figure 35B:
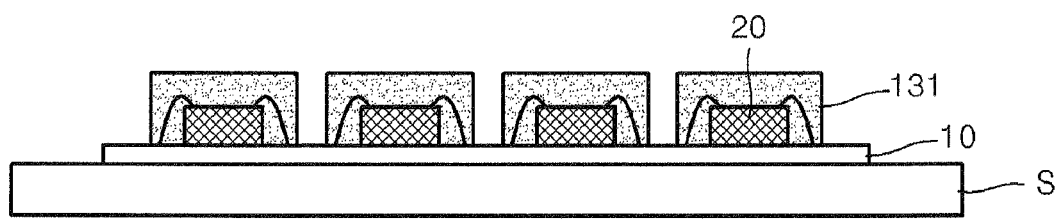

FIGS. 35A and 35B illustrate a method of coating a light emitting device with a phosphor layer according to another embodiment of the present invention. The present embodiment provides a direct pressing method and may be differentiated from the method according to the embodiment described with reference to FIG. 34 in that in the present embodiment, a plurality of phosphor strips 131 are simultaneously coated on a plurality of light emitting devices 20. The phosphor film 300 may be provided and collected in the forms as illustrated in FIG. 34. Alternatively, the phosphor film may be used after removing the cover film 150 from the phosphor film 600 as illustrated in FIG. 28B, prepared to be appropriate for a disposed form of the light emitting devices 20.

Figure 36A:
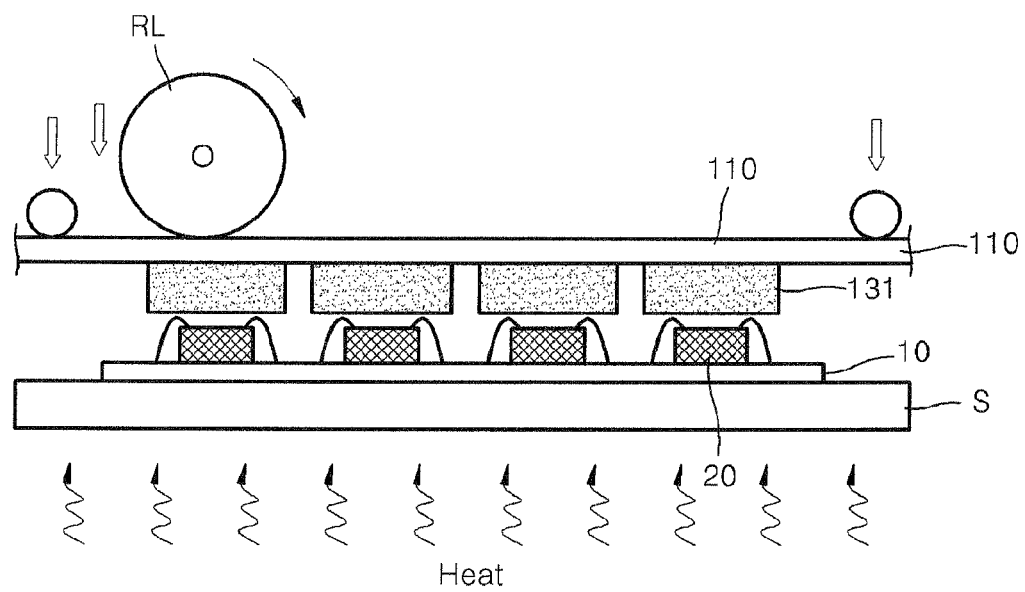
FIGS. 36A and 36B illustrate a method of coating a light emitting device with a phosphor layer according to another embodiment of the present invention.
Figure 36B:
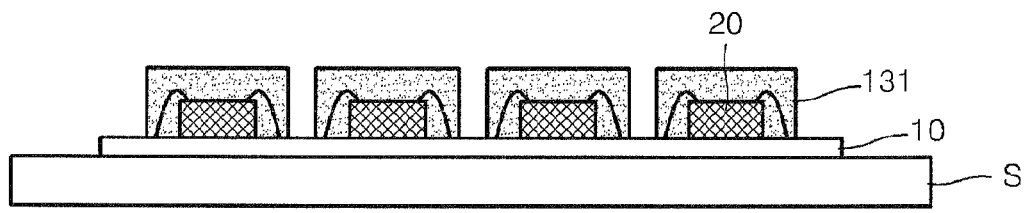

FIGS. 36A and 36B illustrate a method of coating a light emitting device with a phosphor layer according to another embodiment of the present invention. The present embodiment provides a roll and pressing method, in which pressure is sequentially applied to the other surface of the base film 110 by using a roller RL, whereby the plurality of light emitting devices 20 may be coated in order.

Figure 37A:
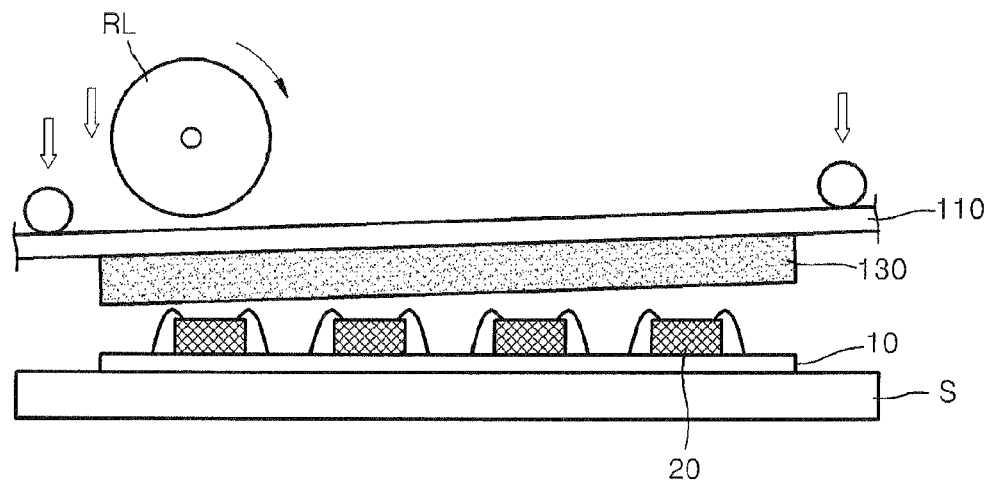
FIGS. 37A, 37B and 37C illustrate a method of coating a light emitting device with a phosphor layer according to another embodiment of the present invention.
Figure 37B:
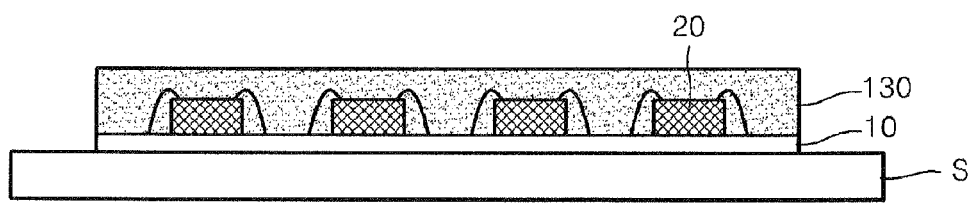
Figure 37C:
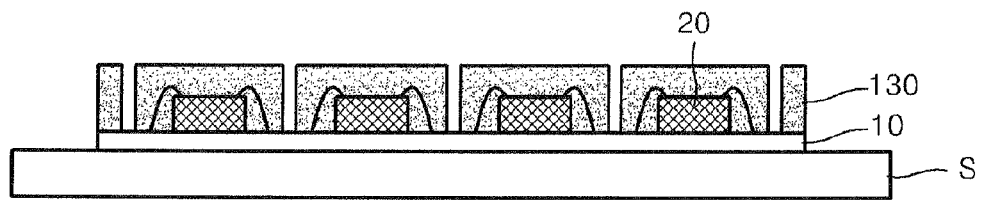

FIGS. 37A, 37B and 37C illustrate a method of coating a light emitting device with a phosphor layer according to another embodiment of the present invention. The present embodiment provides a roll and pressing method, in which the phosphor layer 130 is not divided into phosphor strips in advance. The phosphor film may be used after removing the cover film 150 from the phosphor film 400 prepared to have the form as illustrated in FIG. 8. The phosphor layer 130 may be coated in such a manner that it surrounds the plurality of entire light emitting devices 20 and may then be cut into individual LED chip units 20. In the present embodiment, the vicinity of the plurality of light emitting devices 20 may be coated once by the direct pressing method.

In the coating methods using the phosphor layer described above, the light emitting devices configured to have a wire-bonded form to a substrate is illustrated by way of examples, but the present invention is not limited thereto and is applicable to all types of light emitting devices such as pre-mold type and printed circuit board (PCB)-applied array type light emitting devices, light emitting devices having a flip-chip structure, and the like.

Meanwhile, the coating method using the phosphor layer described above, in which a resin material forming the phosphor layer is manufactured to have a film form having a partially cured state and then to be reheated to then perform the coating, is provided by way of examples, but the present invention is not limited thereto. That is, the coating may also be performed using a dispensing method in which a resin material mixed with phosphor particles having the same physical properties as the phosphor layer of FIG. 1 is dispensed and then re-heated such that the vicinity of the light emitting devices 20 is coated.

Hereinafter, a method of manufacturing a light emitting device package and a light emitting device package manufactured thereby will be described.

Figure 38A:
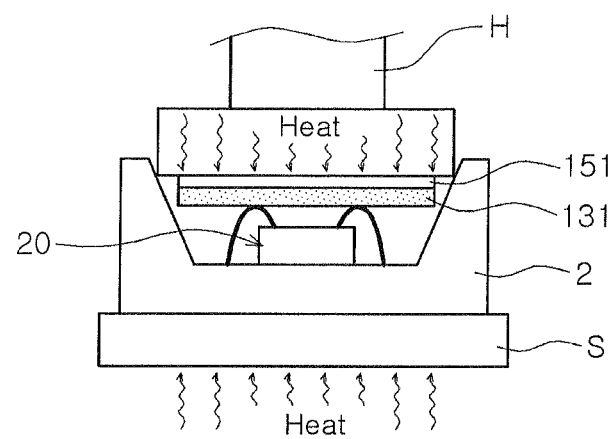
FIGS. 38A and 38B schematically illustrate a method of manufacturing a light emitting device package according to another embodiment of the present invention, and a light emitting device package manufactured thereby.
Figure 38B:
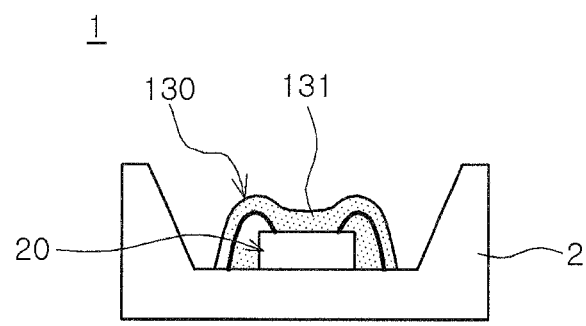

FIGS. 38A and 38B schematically illustrate a method of manufacturing a light emitting device package and a light emitting device package manufactured thereby. The present embodiment provides the method of coating a surface of a light emitting device with a phosphor layer by using the phosphor film 200 manufactured as illustrated in FIG. 15, but a phosphor film used in the present invention is not limited thereto. Here, the light emitting device 20 may include an LED chip having a semiconductor layer and an active layer and may be provided as a single light emitting device or a plurality of light emitting devices. The light emitting device may be mounted on a main body part including a lead frame (not shown) to be electrically connected to the lead frame.

The present embodiment may be characterized in that heat is applied to the phosphor strip 131 to have mobility generated thereby, instead of pressing and adhering the lifted phosphor strip 131 to the vicinity of the light emitting device 20, and the phosphor strip 131 having the mobility generated due to heat may flow toward a surface of the wire-bonded light emitting device 20 due to their own weight, such that the surface of the light emitting device 20 is coated.

In detail, as shown in FIG. 15, the phosphor film 200 including the base film 110 and the phosphor layer 130 formed of a material obtained by mixing phosphor particles in a partially cured resin material and formed on the base film 110 may be first prepared. The phosphor layer 130 may be divided into a plurality of phosphor strips 131, and since physical properties of the phosphor layer 130 are the same as those described with reference to FIGS. 1 and 2, a description thereof is omitted.

FIG. 38A schematically illustrates coating operations. Respective phosphor strips 131 and cover film strips 151 lifted by the pickup head H may be disposed on the light emitting devices 20 such that the phosphor strips 131 face the light emitting devices 20. The phosphor strips 131 may be directly heated by the pickup head H or indirectly heated through the heating stage S including the main body part 2 disposed thereon having the light emitting device 20 mounted therein, such that the phosphor strips 131 have mobility generated thereby. The phosphor strips 131 having the generated mobility may be separated from the cover film strips 151 to flow toward to the light emitting devices 20 due to their own weight, such that they may be coated on the light emitting devices 20 including the wire. Therefore, as shown in FIG. 38B, the phosphor layer 130 formed on the light emitting device 20 by using the phosphor strip 131 may be coated along a shape of the wire to have a form corresponding to the shape of the wire. In addition, the phosphor layer 130 may be coated on sides of the light emitting device 20 in such a manner as integrally coating the active layer. In the case of the light emitting device package 1 shown in FIG. 38B, the case in which two electrodes are formed on an upper surface of the light emitting device 20 to be thus electrically connected to two wires is provided, but the number of the electrodes and the wires may be variable. In addition, the light emitting device package may further include an encapsulating part (not shown) provided with the main body part 2, encapsulating the light emitting device 20 to protect the light emitting device 20.

In the present embodiment, reliability may be enhanced, in that since the wire-bonded light emitting device does not have physical force exerted thereupon, a possibility in which transformation may occur in a wire may be fundamentally prevented. In addition, since the phosphor layer is formed to integrally coat an upper surface of the light emitting device and the sides thereof, including the active layer, a light leakage phenomenon may be prevented and thus, light extraction efficiency may be improved. Further, since the phosphor layer is manufactured to have a film form having a uniform thickness and is used for the coating process, an overall thickness deviation may be reduced and thus, color dispersion between products may be reduced.

On the other hand, the present embodiment describes the case in which a light emitting device is coated in a state in which mobility has been generated by heating phosphor strips having a B-stage cured state, but the present invention is not limited thereto. That is, instead of forming a resin material mixed with phosphor particles having the same physical properties as the phosphor strips to have phosphor strips having a B-stage cured state of a film form, a method of coating the vicinity of the light emitting device 20 by dispensing using a dispenser or the like and then re-heating may be used.

FIGS. 39 to 43 and FIG. 44 schematically illustrate a method of manufacturing a light emitting device package according to another embodiment of the present invention, and a light emitting device package manufactured thereby. The present embodiment may be differentiated from the method and structure of FIGS. 38A and 38B in that the coating is performed except for the electrode provided on the upper surface of the light emitting device and the wire connected thereto. In addition, the present embodiment describes the case in which the coating is simultaneously performed on the plurality of light emitting devices, but the present invention is not limited thereto.

Figure 39:
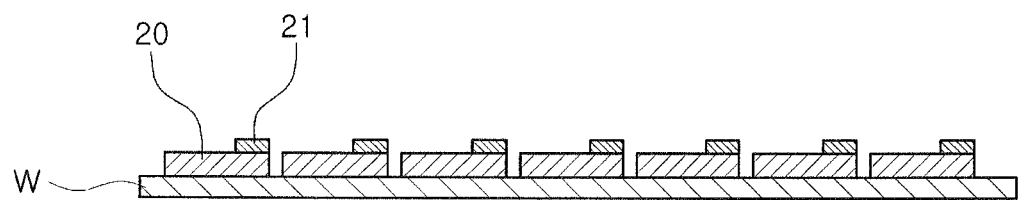
FIGS. 39 to 43 schematically illustrate a method of manufacturing a light emitting device package according to another embodiment of the present invention.

First, the phosphor film 500 may be prepared to have the form as illustrated in FIGS. 9 and 10 and may be used by separating the cover film 150 therefrom. FIG. 39 schematically illustrates an array structure of the light emitting devices 20 to be coated with the phosphor film. As shown in FIG. 39, the light emitting devices 20 may be prepared to have a wafer level state in which a plurality of light emitting devices 20 are arrayed on the wafer W to be divided into individual chips, that is, before being divided. The light emitting device 20 may include an LED chip having a semiconductor layer and an active layer, and may be a vertical type light emitting device in which the electrodes 21 are formed on upper and lower surfaces thereof or a plurality of electrodes 21 are formed on an upper surface thereof.

Figure 40:
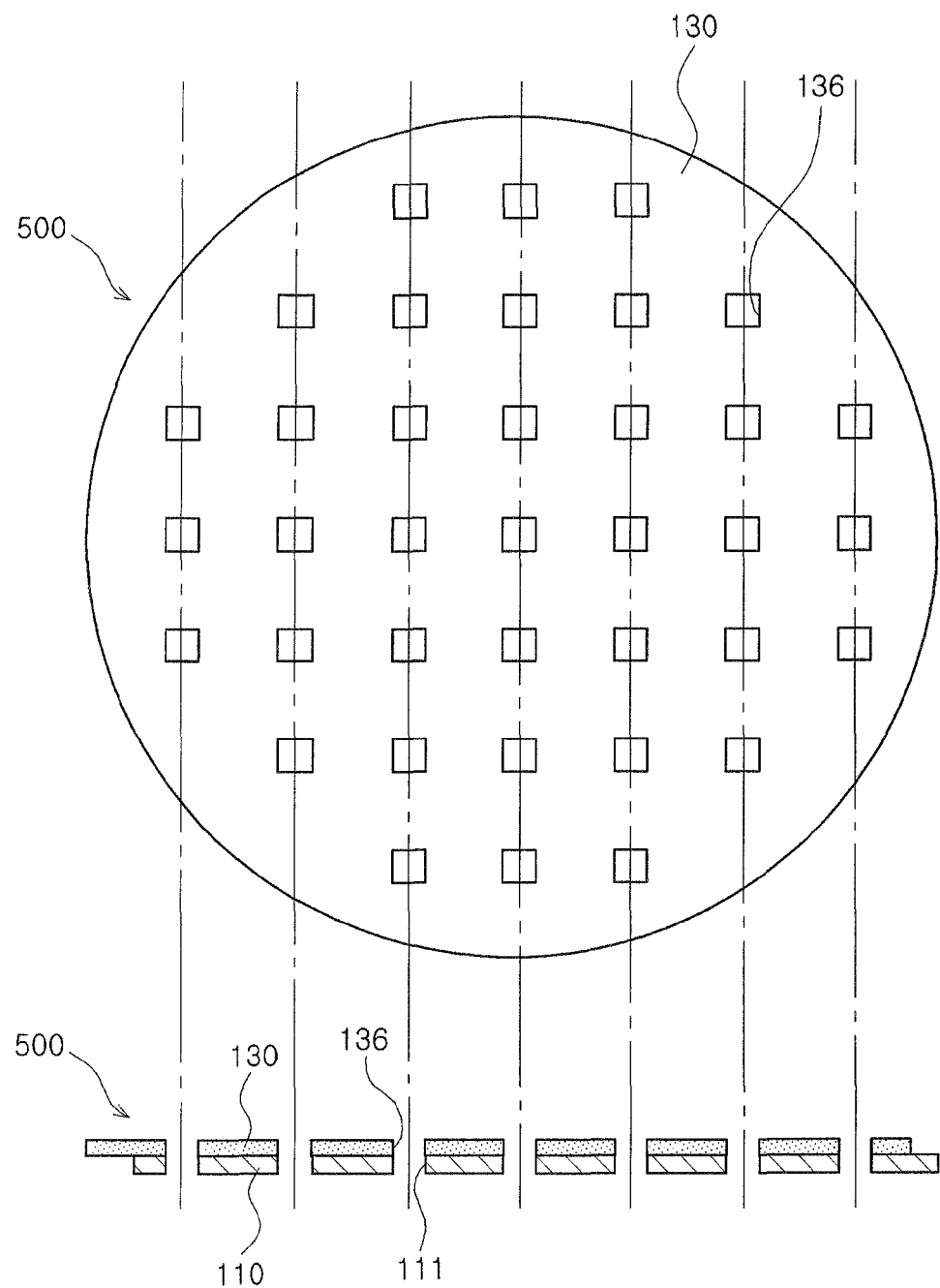

FIG. 40 illustrates a receiving hole patterning operation using molding, punching, laser irradiation, etching, or the like, in which a plurality of receiving holes 136 are formed in the phosphor film 500 to respectively correspond to positions of the electrodes 21 formed on the light emitting devices 20 according to an interval between the light emitting devices 20 arrayed on the wafer W. Here, the base film 110 may include through holes 111 corresponding to positions of the receiving holes 136.

Figure 41:
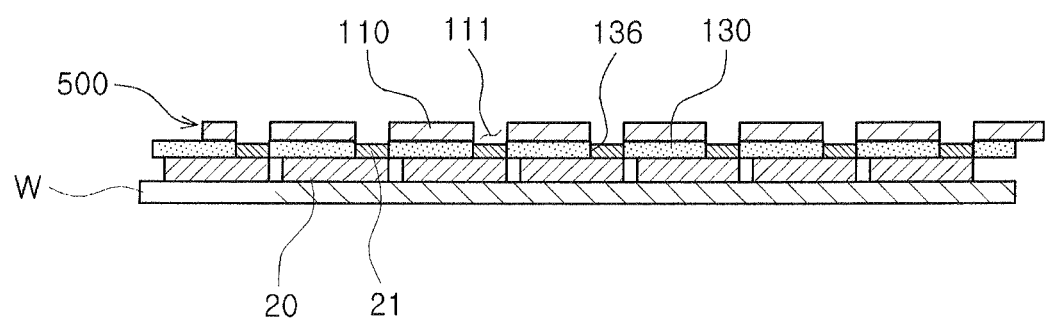
Figure 42:
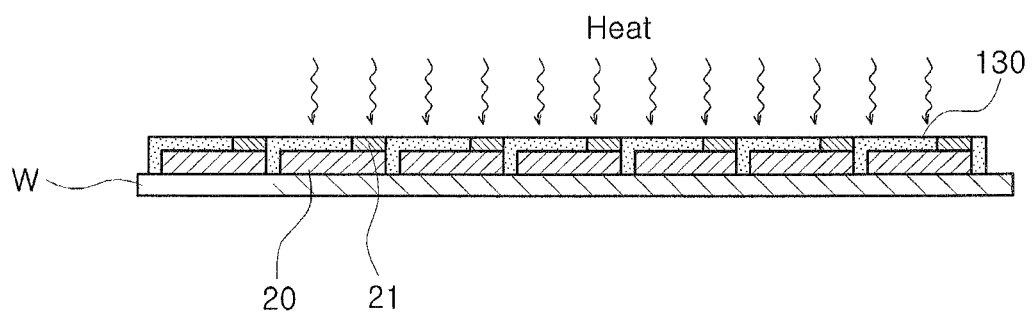
Figure 43:
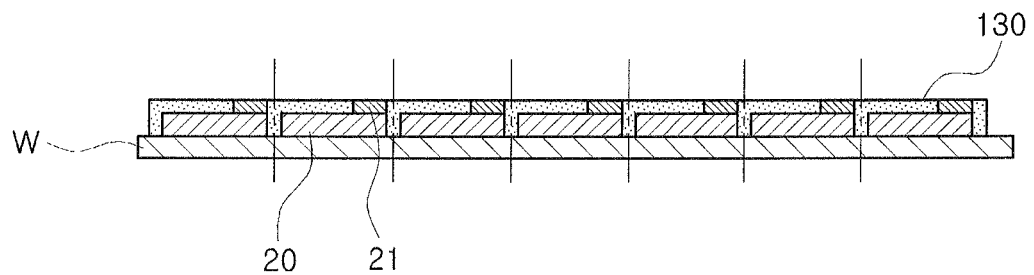

FIG. 41 illustrates an operation in which the phosphor film 500 is adhered to an upper surface of the light emitting device 20. The phosphor film may be adhered to the upper surface of the light emitting device 20 such that the electrodes 21 of the light emitting devices respectively coincide with the receiving holes 136. Therefore, the electrodes 21 of the light emitting devices may be respectively exposed through corresponding receiving holes 136. In addition, as shown in FIG. 42, after the base film 110 is removed, heat may be applied to the phosphor layer 130 to provide mobility therein. The phosphor layer 130 having the generated mobility may flow toward the vicinity of the light emitting device 20 except for the electrode 21, such that at least portions of the upper surface and sides of the light emitting device 20 may be coated therewith.

As such, the phosphor layer 130 may be simultaneously coated on the plurality of light emitting devices 20, and then, a dicing process may be performed to obtain individual light emitting devices 20 coated with the phosphor layer 130 by being cut thereinto.

Figure 44:
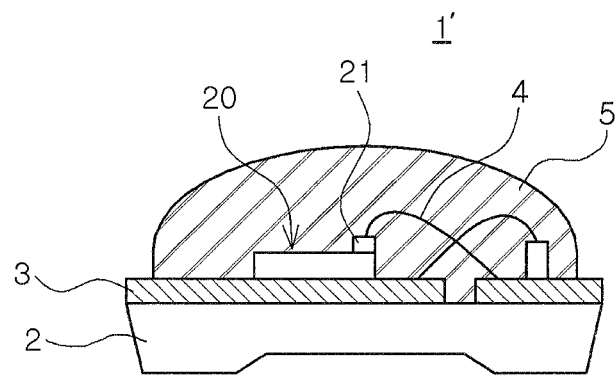
FIG. 44 schematically illustrates a light emitting device package manufactured through the method of FIGS. 39 to 43.

FIG. 44 illustrates a light emitting device package having the light emitting devices 20 mounted therein. Each of the light emitting devices 20 separated with reference to FIG. 43 may be mounted on a lead frame 3 of the main body part 2, and the electrode 21 not coated with the phosphor layer 130 may be electrically connected to the lead frame 3 through a wire 4. In addition, the light emitting device 20 and the wire 4 may be manufactured as a light emitting device package 1' through a packaging process of encapsulating the light emitting device 20 and the wire 4 by an encapsulating part 5.

While the present invention has been shown and described in connection with the embodiments thereof, it will be apparent to those skilled in the art that modifications and variations can be made without departing from the spirit and scope of the invention as defined by the appended claims.

The invention claimed is:

1. A phosphor film comprising:
a base film;
a phosphor layer formed on the base film and obtained by mixing phosphor particles in a partially cured resin material; and
a cover film formed on the phosphor layer to protect the phosphor layer,
wherein the phosphor layer is configured of a plurality of phosphor strips spaced apart from one another by a predetermined interval,
wherein the cover film is formed of a single film and covers all of the plurality of phosphor strips.

2. A phosphor film comprising:
a base film;
a phosphor layer formed on the base film and obtained by mixing phosphor particles in a partially cured resin material; and
a cover film formed on the phosphor layer to protect the phosphor layer,
wherein the phosphor layer is in a partially cured state at a normal temperature and has a phase change to be movable upon being heated.

3. The phosphor film of claim 1, wherein the phosphor layer has a structure in which at least one or more layers are stacked.

4. The phosphor film of claim 3, wherein the phosphor layer includes a first layer formed on the base film and a second layer formed on the first layer, and resin materials respectively forming the first and second layers have different properties.

5. The phosphor film of claim 4, wherein the resin material forming the first layer has greater strength than the resin material forming the second layer, and the resin material forming the second layer has higher adhesive force than the resin material forming the first layer.

6. A method of manufacturing a phosphor film comprising:
preparing a base film;
forming a phosphor layer on the base film, the phosphor layer being formed of a material obtained by mixing phosphor particles in a partially cured resin material and configured of a plurality of phosphor strips spaced apart from one another by a predetermined interval; and
heating the phosphor layer while the phosphor layer is in a partially cured state at a normal temperature, wherein the phosphor layer has a phase change to be movable upon being heated.

7. The method of claim 6, wherein the forming of the phosphor layer includes:
forming a thin film on the base film, the thin film being obtained by mixing the phosphor particles in the partially cured resin material;
forming a cover film on the thin film;
forming a cutting line along which the thin film and the cover film are cut into strips having a predetermined size; and
expanding the base film such that the thin film and the cover film are separated along the cutting line.

8. The method of claim 7, wherein the forming of the cutting line includes forming a plurality of first cutting lines on the thin film and the cover film to be in line in a single direction; and
cutting the thin film, the cover film and the base film along a second cutting line perpendicular to the first cutting line to have a strip form.

9. The method of claim 6, wherein the forming of the phosphor layer includes:
forming a thin film on the base film, the thin film being obtained by mixing the phosphor particles in the partially cured resin material;
forming a plurality of first cutting lines on the thin film to be in line in a single direction;
expanding the base film such that the thin film is divided into a plurality of regions along the first cutting lines;
forming a cover film on the thin film; and
cutting the cover film, the thin film and the base film along a second cutting line perpendicular to the first cutting lines to have a strip form.

10. The method of claim 6, wherein the forming of the phosphor layer includes:
disposing a mask on the base film, the mask including a plurality of holes having a size corresponding to that of the plurality of phosphor strips;
forming a thin film by printing the material obtained by mixing the phosphor particles in the partially cured resin material on the base film, by using the mask; and
forming a cover film on the thin film.

11. The method of claim 7, wherein in the forming of the phosphor layer, the thin film has a structure in which at least one or more layers are stacked,
wherein the thin film includes a first layer formed on the base film and a second layer formed on the first layer, and resin materials respectively forming the first and second layers have different properties.

12. The method of claim 11, wherein the resin material forming the first layer has greater strength than the resin material forming the second layer, and the resin material forming the second layer has higher adhesive force than the resin material forming the first layer.

13. The method of claim 10, further comprising cutting the base film to have a strip form.

14. The phosphor film of claim 2, wherein the phosphor layer has a structure in which at least one or more layers are stacked.

15. A light emitting device package, comprising:
at least one light emitting device; and
the phosphor layer of claim 2 covering the at least one light emitting device.

* * * * *